United States Patent
Blauvelt et al.

(10) Patent No.: US 6,917,636 B2
(45) Date of Patent: Jul. 12, 2005

(54) GRATING-STABILIZED SEMICONDUCTOR LASER

(75) Inventors: Henry A. Blauvelt, San Marino, CA (US); David W. Vernooy, Sierra Madre, CA (US); Joel S. Paslaski, Alhambra, CA (US)

(73) Assignee: Xponent Photonics Inc, Monrovia, CA (US)

( * ) Notice: Subject to any disclaimer, the term of this patent is extended or adjusted under 35 U.S.C. 154(b) by 0 days.

(21) Appl. No.: 10/630,319

(22) Filed: Jul. 30, 2003

(65) Prior Publication Data

US 2004/0037342 A1 Feb. 26, 2004

Related U.S. Application Data

(60) Provisional application No. 60/466,799, filed on Apr. 29, 2003, provisional application No. 60/462,600, filed on Apr. 11, 2003, provisional application No. 60/442,289, filed on Jan. 24, 2003, provisional application No. 60/442,288, filed on Jan. 24, 2003, and provisional application No. 60/405,590, filed on Aug. 22, 2002.

(51) Int. Cl.$^7$ ................................................ H01S 3/13
(52) U.S. Cl. ............................ 372/32; 372/20; 372/102
(58) Field of Search .............................. 372/20, 32, 50, 372/102; 385/37, 50

(56) References Cited

U.S. PATENT DOCUMENTS

| | | | |
|---|---|---|---|
| 4,156,206 A | | 5/1979 | Comerford et al. |
| 4,786,132 A | | 11/1988 | Gordon |
| 4,811,352 A | | 3/1989 | Suzuki et al. |
| 5,043,991 A | | 8/1991 | Bradley |
| 5,123,070 A | * | 6/1992 | Bradley ........................ 385/37 |
| 5,265,177 A | | 11/1993 | Cho et al. |
| 5,402,511 A | | 3/1995 | Malone et al. |
| 6,064,783 A | | 5/2000 | Congdon et al. |
| 6,282,219 B1 | | 8/2001 | Butler et al. |
| 6,320,888 B1 | | 11/2001 | Tanaka et al. |
| 2002/0197013 A1 | * | 12/2002 | Liu et al. ........................ 385/37 |
| 2003/0081902 A1 | * | 5/2003 | Blauvelt et al. .............. 385/50 |
| 2004/0165812 A1 | | 8/2004 | Blauvelt et al. |

OTHER PUBLICATIONS

Abe et al, Optical path length trimming technique using thin film heaters for silica–based waveguides on Si, Electronics Letters, Sep. 12, 1996, Page(s) 1818–1820, vol. 32, No. 19.

Bouadma et al, Integration of a laser Diode With a Polymer–Based Waveguide for Photonic Integrated Circuits, IEEE Photonics Technology Letters, Oct. 1994, Page(s) 1188–1190, vol. 6, No. 10.

Eldada et al, Advances in Polymer Integrated Optics, IEEE Journal of Selected Topics in Quantum Electronics, Jan. 2000, Page(s) 54–68, vol. 6, No. 1.

Moshrefzadeh et al, Temperature dependence of Index of Refraction of Polymeric Waveguides, Journal of Lightwave Technology, Apr. 1992, Page(s) 420–425, vol. 10, No. 4.

(Continued)

*Primary Examiner*—Minsun Oh Harvey
*Assistant Examiner*—James Menefee
(74) *Attorney, Agent, or Firm*—David S. Alavi; Christie Parker & Hale LLP

(57) ABSTRACT

A grating-stabilized semiconductor laser comprises a semiconductor laser gain medium, an integrated low-index waveguide, and a waveguide grating segment providing optical feedback for laser oscillation. The laser may be adapted for multi-mode or single-mode operation. A multiple-mode laser may oscillate with reduced power and/or wavelength fluctuations associated with longitudinal mode wavelength shifts, relative to Fabry-Perot lasers lacking gratings. A single-mode laser may include a compensator, wavelength reference, and detector for generating an error signal, and a feedback mechanism for controlling the compensator for maintaining the laser wavelength locked to the reference. The laser may include means for altering, enhancing, tuning, and/or stabilizing the waveguide grating reflectivity spectral profile. The laser may be adapted for optical transverse-coupling to another waveguide.

12 Claims, 15 Drawing Sheets

OTHER PUBLICATIONS

Olsson et al, Performance Characteristics of a 1.5 um Single–Frequency Semiconductor Laser with an External Waveguide Bragg Reflector, IEEE Journal of Quantum Electronics, Feb. 1988, Page(s) 143–147, vol. 24, No. 2.

Paoletti et al, 15–GHz Modulation Bandwidth, Ultralow–Chirp 1–55–um Directly Modulated Hybrid Distributed Bragg Reflector Laser Source, IEEE Photonics Technology Letters, Dec. 1998, Page(s) 1691–1693, vol. 10, No. 12.

Park et al, A Novel Wavelength Stabilization Scheme Using a Fiber Grating for WDM Transmission, IEEE Photonics Technology Letters, Oct. 1998, Page(s) 1446–1448, vol. 10, No. 10.

Pezeshki et al, A gratingless wavelength stabilized semiconductor laser, Applied Physics Letters, Nov. 4, 1996, Page(s) 2807–2809, vol. 69, No. 19.

Ribot et al, Improved Design for the Monolithic Integration of a Laser and an Optical Waveguide Coupled by an Evanescent Field, IEEE Journal of Quantum Electronics, Nov. 1990, Page(s) 1930–1941, vol. 26, No. 11.

Studenkov et al, Asymmetric Twin–Waveguide 1.55–um Wavelength laser with a Distributed Bragg Reflector, IEEE Photonics Technology Letters, May 2000, Page(s) 468–470, vol. 12, No. 5.

Tanaka et al, PLC–type hybrid external cavity laser Integrated with front–monitor photodiode on Si platform, Electronics Letters, Jan. 18, 2001, Page(s) 95–97, vol. 37, No. 2.

Tanaka et al, Hybrid–Integrated External–Cavity Laser Without Temperature–Dependent Mode Hopping, Journal of Lightwave Technology, Sep. 2002, Page(s) 1730–1739, vol. 20, No. 9.

Tanaka et al, 100–GHz Spacing Eight–Channel Light Source Integrated With Gratings and LDs on PLC Platform, IEEE Photonics Technology Letters, Sep. 2002, Page(s) 1348–1350, vol. 14, No. 9.

Tanaka et al, Hybrid–Integrated External–Cavity Laser Without Temperature–Dependent Mode Hopping, Electronics Letters, Jan. 21, 1999, vol. 35, No. 2.

International Search Report for App. No. PCT/US03/23752 dated No. 17, 2004 (three pages).

* cited by examiner

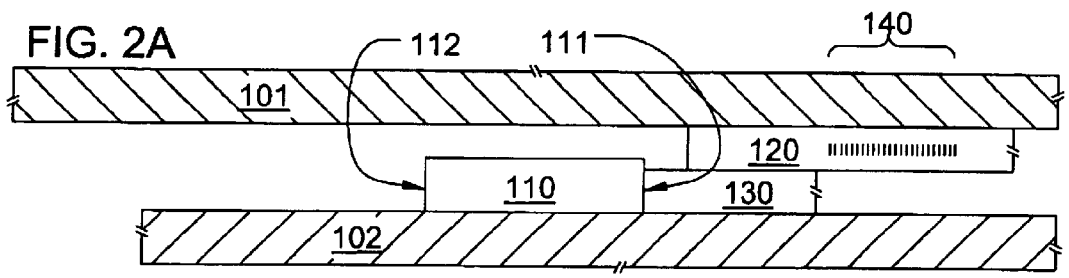
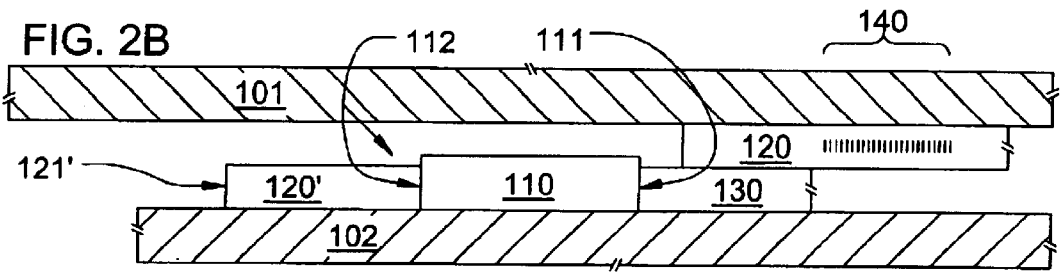
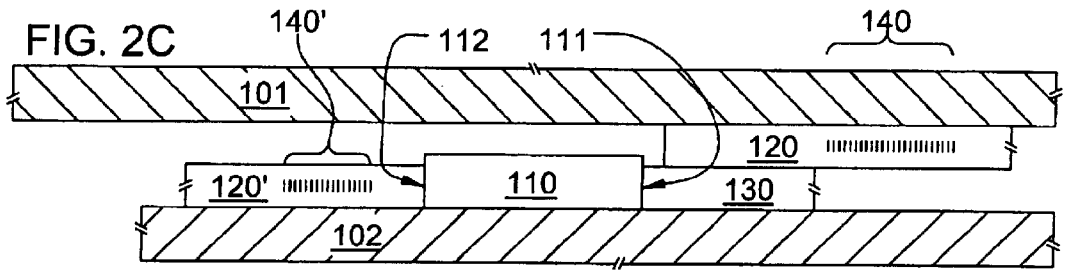
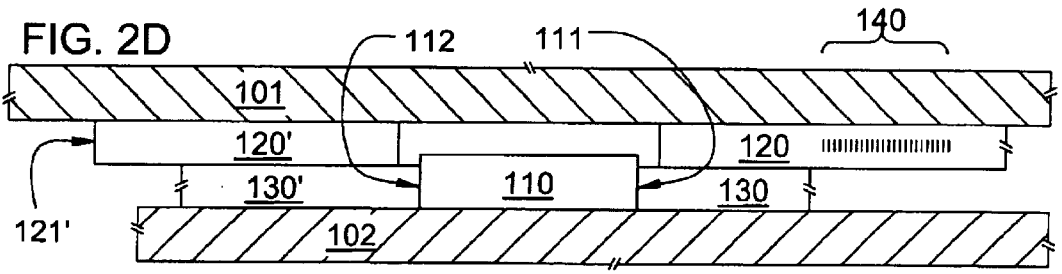
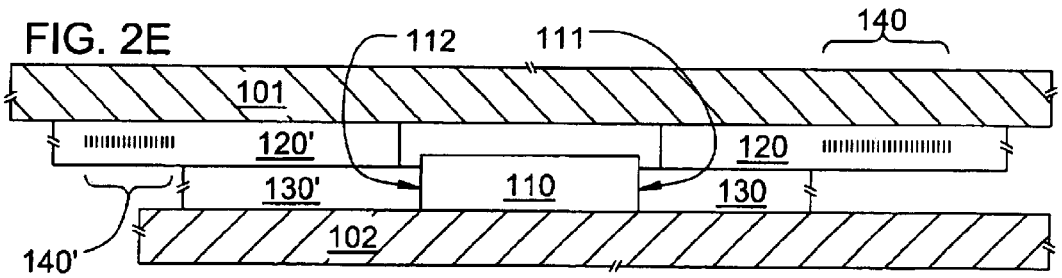

GRATING-STABILIZED SEMICONDUCTOR LASER

RELATED APPLICATIONS

This application claims benefit of the following U.S. provisional patent applications:

Application Ser. No. 60/405,590 entitled "Grating-stabilized semiconductor laser" filed Aug. 22, 2002 in the names of Henry A. Blauvelt and David W. Vernooy, said provisional application being hereby incorporated by reference as if fully set forth herein;

Application Ser. No. 60/442,288 entitled "Etched-facet semiconductor optical component with integrated end-coupled waveguide and methods of fabrication and use thereof" filed Jan. 24, 2003 in the names of Henry A. Blauvelt, David W. Vernooy, and Joel S. Paslaski, said provisional application being hereby incorporated by reference as if fully set forth herein;

Application Ser. No. 60/442,289 entitled "Grating-stabilized semiconductor laser" filed Jan. 24, 2003 in the names of Henry A. Blauvelt, David W. Vernooy, and Joel S. Paslaski, said provisional application being hereby incorporated by reference as if fully set forth herein;

Application Ser. No. 60/462,600 entitled "Etched-facet semiconductor optical component with integrated end-coupled waveguide and methods of fabrication and use thereof" filed Apr. 11, 2003 in the names of Charles I. Grosjean, Hao Lee, Franklin G. Monzon, Katrina H. Nguyen, and Rolf A. Wyss, said provisional application being hereby incorporated by reference as if fully set forth herein; and Application Ser. No. 60/466,799 entitled "Low-profile-core and thin-core optical waveguides and methods of fabrication and use thereof" filed Apr. 29, 2003 in the names of David W. Vernooy, Joel S. Paslaski, and Guido Hunziker, said provisional application being hereby incorporated by reference as if fully set forth herein.

BACKGROUND

The field of the present invention relates to semiconductor lasers. In particular, apparatus and methods are described herein for frequency stabilization of a semiconductor laser.

Semiconductor laser sources are prevalent light sources employed for fiber-optic telecommunications. Data is typically encoded on an optical carrier by intensity modulation of the laser output. Multiple data channels may be carried on a single optical fiber using wavelength division multiplexing (WDM) techniques, wherein multiple optical carrier wavelengths propagate simultaneously through the fiber, each independently modulated for encoding an independent data stream. Laser sources for such a system must therefore enable high-speed intensity modulation while maintaining stable emission wavelength. Simple Fabry-Perot semiconductor lasers may be readily and inexpensively manufactured, but typically have relatively large spectral widths and/or relatively large wavelength/temperature coefficients. Distributed feedback semiconductor lasers (DFB lasers) and other single-longitudinal-mode lasers may be fabricated and operated with less variation in output wavelength, but are susceptible to feedback and/or interference from back-reflections from the optical transmission system and are difficult and expensive to manufacture. Precise matching of a longitudinal mode frequency to the reflectivity spectral profile of the DFB waveguide grating is also problematic, and can lead to undesirable mode hops. It should be pointed out that design requirements and/or constraints for semiconductor laser sources may be dictated in part by properties of previously-deployed optical fiber that will carry the laser output. Set forth hereinbelow are a variety of exemplary embodiments, and methods of fabrication, of semiconductor lasers including waveguide gratings adapted for wavelength stabilization of the laser output.

SUMMARY

A grating-stabilized semiconductor laser comprises: a semiconductor laser gain medium; a low-index optical waveguide integrated with the laser gain medium on a laser substrate; and a waveguide grating segment. The integrated waveguide is optically end-coupled at its proximal end with a first end face of the laser gain medium. The waveguide grating segment may be formed as a portion of the integrated waveguide, or on a waveguide substrate separate from the laser substrate and subsequently assembled therewith. The waveguide grating segment forms a first laser resonator mirror, while a second laser resonator mirror may be formed by a second end face of the laser gain medium, by and end face of a second waveguide coupled to the laser gain medium through the second end face, or by a second waveguide grating segment coupled to the laser gain medium through the second end face.

For multiple-longitudinal-mode operation, the waveguide grating segment may be adapted (by suitable spectral bandwidth engineering) and/or the laser may be adapted (by suitable engineering of the mode spacing) for enabling simultaneous laser oscillation in multiple longitudinal modes, and/or for simultaneously providing grating reflectivity within about 1% of the peak waveguide grating reflectivity for multiple longitudinal modes. Thus spectral width and/or spectral shifts of the semiconductor laser output may be reduced (relative to a Fabry-Perot laser without a grating) while rendering the grating-stabilized semiconductor laser less susceptible to optical feedback and maintaining the laser output wavelength near the desired design wavelength. Near-peak waveguide grating reflectivity for multiple modes reduces the magnitude of laser output power and/or wavelength fluctuations resulting from shifting longitudinal mode wavelengths.

For single-longitudinal-mode operation, the waveguide grating segment may be adapted (by suitable spectral bandwidth engineering) and/or the laser may be adapted (by suitable engineering of the mode spacing) for enabling laser oscillation substantially restricted to a single longitudinal mode. The single-longitudinal-mode grating-stabilized laser may further comprise: a compensator for enabling control of longitudinal mode wavelengths; a wavelength reference generating an error signal; and a feedback mechanism for controlling the compensator in response to the error signal. The feedback mechanism, wavelength reference, and compensator may function together to maintain a longitudinal mode frequency substantially matched with the laser waveguide grating wavelength, thereby enabling stable single-mode operation of the semiconductor laser. A wide variety of feedback mechanisms may be employed. A dual-waveguide-grating reference may be employed for locking a longitudinal mode wavelength relative to a center wavelength for the waveguide grating segment.

Grating-stabilized semiconductor lasers disclosed herein may further comprise adaptations for one or more of the following: enabling optical transverse-coupling between the grating-stabilized laser and another waveguide; decreasing susceptibility to optical feedback; enhancing the effective reflectivity of a waveguide grating resonator mirror; reducing optical losses from the laser resonator, grating waveguide segment, and/or other optical waveguides; substantially suppressing one or more unwanted grating diffraction orders; providing an operationally acceptable degree of wavelength accuracy; providing operationally acceptable stability for the laser wavelength and/or output power with respect to ambient temperature; enabling or facilitating adjustment of the laser output wavelength. Spatially selective material processing may be employed for forming concurrently multiple semiconductor lasers and/or waveguide gratings on a common substrate wafer.

Objects and advantages pertaining to grating-stabilized semiconductors lasers, as disclosed and/or claimed herein, may become apparent upon referring to the disclosed exemplary embodiments as illustrated in the drawings and disclosed in the following written description and/or claims.

BRIEF DESCRIPTION OF THE DRAWINGS

FIGS. 2A through 2E are schematic side views of various exemplary grating-stabilized semiconductor lasers

Figure 1A:
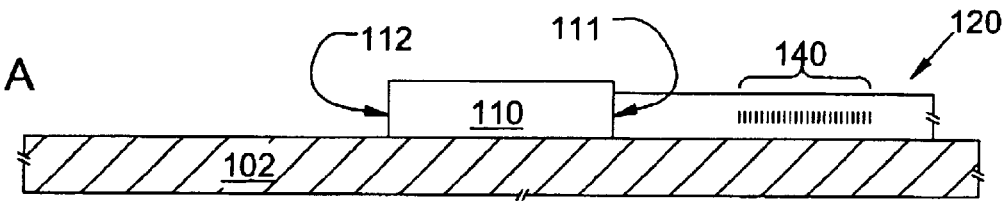
FIGS. 1A through 1F are schematic side views of various exemplary grating-stabilized semiconductor lasers.

It should be noted that the relative proportions of various structures shown in the Figures may be distorted to more clearly illustrate the exemplary embodiments. Relative dimensions of various devices, lasers, waveguides, resonators, fibers, and so forth may be distorted, both relative to each other as well as in their relative transverse and/or longitudinal proportions. In many of the Figures the transverse dimension of an optical element is enlarged relative to the longitudinal dimension for clarity, which will cause variations of transverse dimension(s) with longitudinal position to appear exaggerated. In the various embodiments illustrated, a waveguide and grating segment thereof are typically shown as being longer than the laser gain medium to which they are coupled. Any relative lengths of the laser gain medium and a waveguide coupled thereto (including a waveguide grating segment) may be employed while remaining within the scope of the present disclosure. Laser gain media may be employed that are shorter than the waveguide, of a length similar to the waveguide, or that may be 5, 10, 20, or more times the length of the waveguide. In the various waveguide gratings depicted schematically in the Figures, the grating spacings may not be shown to scale, and a number of "grooves" or "lines" shown for a grating may be considerably fewer than would be present in an actual waveguide grating. Graphs of error signals, reflectivity profiles, and so forth are intended to illustrate typical behaviors and/or trends, and are qualitative in nature.

The embodiments shown in the Figures are exemplary, and should not be construed as limiting the scope of the present invention as disclosed and/or claimed herein.

DESCRIPTION OF EXEMPLARY EMBODIMENTS

FIGS. 1A through 1F each illustrate schematically a semiconductor laser gain medium 110 and an optical waveguide 120, each adapted and positioned on a common semiconductor substrate 102 for enabling optical power transfer therebetween (in a variety of ways, described further hereinbelow; also referred to as optical coupling). The laser gain medium 110 may typically comprise III–V semiconductor materials on a III–V substrate (such as InP). Other suitable semiconductor laser and/or substrate materials may be equivalently employed to provide optical gain at any available desired laser operating wavelengths, including visible, near IR, and mid-IR wavelengths, as well as other wavelengths that may become accessible in the future with the development of new materials. The optical waveguide 120 includes a waveguide grating segment 140 providing a suitable spectral reflectivity profile, and may be formed from semiconductor material(s) (including III–V materials and other suitable semiconductor materials) or from low-index materials including silica, silica-based materials, other glasses, silicon nitride and oxynitrides, polymers, and so forth, or from any other suitable optical material. The laser gain medium 110 and at least a portion of waveguide 120 (including waveguide grating segment 140) comprise at least a portion of a composite laser optical resonator, with waveguide grating segment 140 acting as one resonator end mirror and as a spectrally dependent element for controlling the spectral properties of the semiconductor laser.

Figure 1B:
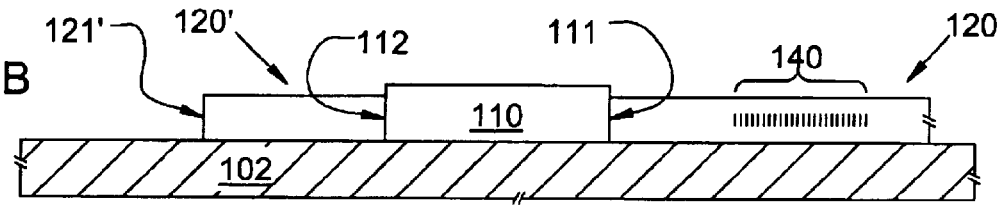
Figure 1C:
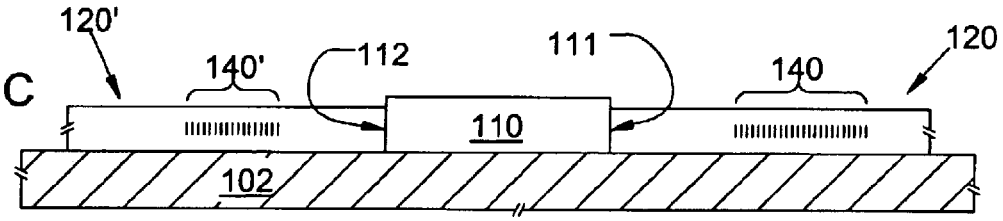
Figure 1D:
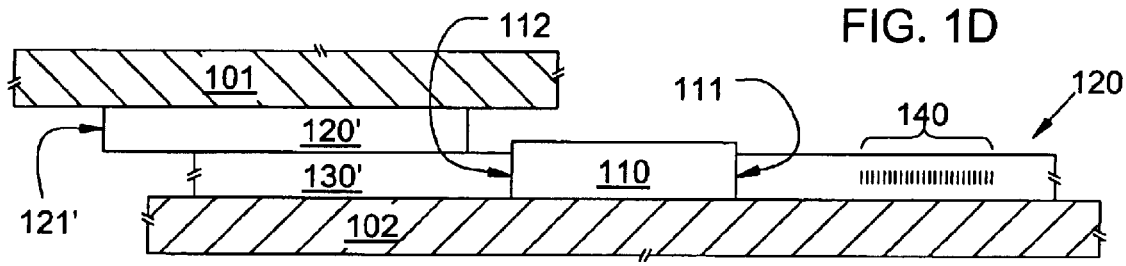

In FIG. 1A, waveguide 120 is formed on substrate 102 along with laser gain medium 110. The end face (equivalently, end facet) 112 of the laser gain medium 110 opposite waveguide 120 may be provided with a suitable reflective coating so as to serve as the second resonator end mirror (or index contrast between semiconductor gain medium 110 and its surroundings may provide sufficient reflectivity). The other end face 111 of the laser gain medium (the end face nearest waveguide 120) and/or the proximal end of waveguide 120 may be suitably adapted for substantially suppressing laser oscillation supported by the laser gain medium 110 alone, while enabling laser oscillation supported by the composite laser resonator (via optical end-coupling or end-transfer between gain medium and integrated waveguide). End face 111 and the proximal end of waveguide 120 may be further adapted for altering the performance characteristics of the semiconductor laser (described further hereinbelow). Either or both of end face 112 and grating waveguide segment 140 may transmit a portion of the optical power resonating within the semiconductor laser resonator, thereby functioning as an output coupler. Laser output transmitted through waveguide grating segment 140 (if any) continues to propagate along waveguide 120, which may terminate at a distal end face (cleaved or wafer-scale processed; not shown), and at least a portion of this output of the semiconductor laser may be transmitted through this end face (for end-transfer into another waveguide, for collection by one or more collection optics, or to freely propagate). Alternatively, a portion of waveguide 120 distal to the waveguide grating segment 140 may be suitably adapted for transverse-transfer (mode-interference-coupled, or substantially adiabatic-coupled) of at least a portion of any laser output propagating through waveguide 120 into another suitably adapted optical waveguide 150 on a separate substrate 101 (FIG. 1F). Laser output transmitted through end face 112 (if any) may propagate freely away therefrom, may be at least partially collected by one or more collection optics (not shown), or may be at least partially received into an end-coupled transmission waveguide (not shown).

Instead of terminating at end face 112 of the laser gain medium 110, the semiconductor laser may include a second waveguide 120', at least a portion of waveguide 120' forming a portion of the composite laser resonator. In FIGS. 1B and 1C, waveguide 120' is formed on substrate 102 along with laser gain medium 110, and is positioned for optical end-coupling therewith. Waveguide 120' may instead be formed on a separate substrate 101 and assembled with laser gain medium 110, as in FIGS. 1D and 1E. As in the embodiment of FIG. 1A, end face 111 of laser gain medium 110 and/or the proximal portion of waveguide 120 may be adapted for substantially suppressing laser oscillation supported by the laser gain medium 110 alone or supported by gain medium 110 and waveguide 120' without waveguide 120, while enabling laser oscillation supported by the composite laser resonator (via optical coupling between the gain medium and the waveguides). Additionally, end face 112 of laser gain medium 110 and/or the proximal portion of waveguide 120' may be adapted for substantially suppressing laser oscillation supported by the laser gain medium 110 alone or supported by gain medium 110 and waveguide 120 without waveguide 120', while enabling laser oscillation supported by the composite laser resonator. One or more of end face 111, end face 112, the proximal end of waveguide 120, and the proximal end of waveguide 120' may be further adapted for altering the performance characteristics of the semiconductor laser (described further hereinbelow).

Figure 1E:
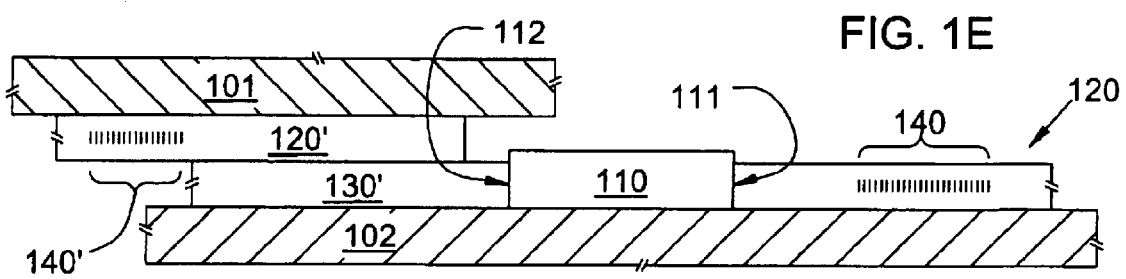
Figure 1F:
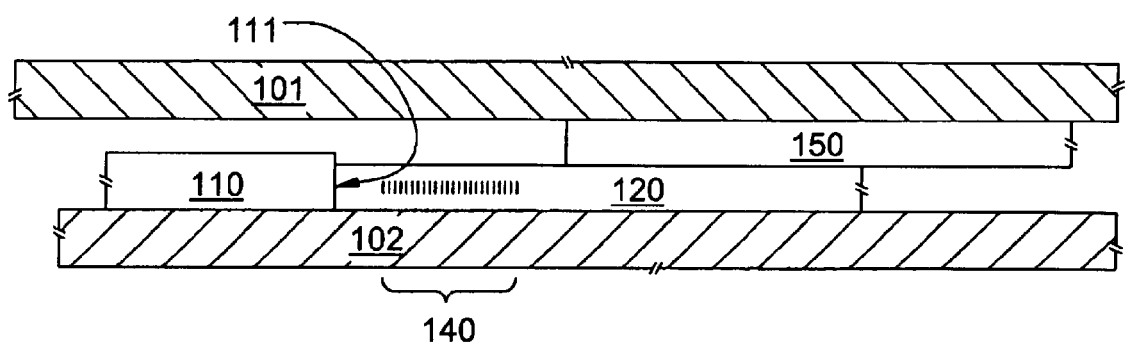

The second waveguide 120' may include a distal end face 121' with a suitable reflective coating so as to function as a laser resonator end mirror (FIGS. 1B and 1D), or may include a second grating waveguide segment 140' providing a suitable spectral reflectivity profile so as to act as a laser resonator end mirror and to provide additional modification and/or control of the semiconductor spectral properties (FIGS. 1C and 1E). Laser output may be: transmitted through waveguide grating segment 140 to propagate along waveguide 120 (as described hereinabove); transmitted through grating waveguide segment 140' (if present) to propagate along waveguide 120', and/or transmitted through waveguide end face 121' (if present). Laser output transmitted through end face 121' (if any) may propagate freely away therefrom, may be at least partially collected by one or more collection optics (not shown), or may be at least partially received into an end-coupled transmission waveguide (not shown). Laser output transmitted through waveguide grating segment 140' (if any) continues to propagate along waveguide 120', which may terminate at a distal end face (cleaved or wafer-scale processed; not shown), and at least a portion of this output of the semiconductor laser may be transmitted through this end face (for end-transfer into another waveguide, for collection by one or more collection optics, or to freely propagate). Alternatively, a portion of waveguide 120' distal to the waveguide grating segment 140' may be suitably adapted for transverse-transfer (mode-interference-coupled, or substantially adiabatic-coupled) of at least a portion of any laser output propagating through waveguide 120' into another suitably adapted optical waveguide (not shown; analogous to FIG. 1F).

In FIGS. 1D and 1E, laser gain medium 110, waveguide 120, and grating waveguide segment 140 are formed on semiconductor substrate 102, while waveguide 120' is formed on a separate waveguide substrate 101. Substrates 101 and 102 are assembled together (using so-called "flip-chip" mounting or other suitable mounting scheme) so as to enable optical power transfer between laser gain medium 110 and waveguide 120'. A composite laser resonator is thereby formed comprising laser gain medium 110 and at least a portion of waveguide 120 on substrate 102, and at least a portion of waveguide 120' on substrate 101. Laser gain medium 110 and waveguide 120' may be adapted for end-transfer (not shown) or transverse-transfer (FIGS. 1D and 1E) of optical power therebetween. Substrates 101 and/or 102 are typically adapted for facilitating sufficiently accurate relative positioning of laser gain medium 110 and waveguide 120' for achieving a level of optical power transfer that enables laser oscillation. Waveguide substrate 101 may include one or more additional waveguides and/or other optical structures that form an optical system or subsystem coupled to the semiconductor laser via waveguide 120'.

Direct optical power transfer may be employed (not shown) between laser gain medium 110 and waveguide 120' assembled therewith, or an intermediate external transfer waveguide 130' integrated onto substrate 102 along with gain medium 110 may be employed for transferring optical power between laser gain medium 110 and waveguide 120' (FIGS. 1D and 1E). Integrated external transfer waveguide 130' may typically be adapted for end-transfer with laser gain medium 110, and for transverse-transfer (mode-interference-coupled or substantially adiabatic) with waveguide 120', and forms a portion of the composite laser resonator. Mode-interference-coupled transverse transfer may be employed to further modify and/or control spectral characteristics of the semiconductor laser, while substantially adiabatic transverse transfer may be employed for improving optical power transfer efficiency, substantially avoiding wavelength dependence of transverse-transfer, and/or relaxing alignment tolerances for the assembled waveguides. An external transfer waveguide as employed herein may be formed on semiconductor substrate 102 from the same or similar semiconductor materials as laser gain medium 110, or may be fabricated on semiconductor substrate 102 from low-index materials differing from those employed for forming the laser gain medium 110, such low-index materials including, for example, silica, silica-based materials, other glasses, silicon nitride and oxynitrides, polymers, and so on. Use of such an external transfer waveguide for optical power transverse-transfer between optical structures on initially separate substrates that are subsequently assembled together, optical structures and adaptations thereof for enabling the same, and optical structures and adaptations of waveguide 120' for enabling the same, are described in detail in prior-filed U.S. application Ser. No. 10/187,030, application Ser. No. 60/360,261, and application Ser. No. 60/334,705. Waveguides 120 and 130' may be integrated with laser gain medium 110 on substrate 102 using any of the wide array of structures and fabrication schemes therefor, as well as various adaptations of end faces 111/112 and the proximal ends of waveguides 120/130', as disclosed in earlier-cited application Ser. No. 60/442,288, application Ser. No. 60/462,600, and application Ser. No. 60/466,799.

FIGS. 2A–2E each illustrate schematically a semiconductor laser gain medium 110, formed on a semiconductor substrate 102, and an optical waveguide 120, formed on a separate waveguide substrate 101 and including waveguide grating segment 140 providing a suitable spectral reflectivity profile. Substrates 101 and 102 are assembled together (using so-called "flip-chip" mounting or other suitable mounting scheme) so as to enable optical power transfer between laser gain medium 110 and waveguide 120, thereby forming a composite laser resonator that includes both laser gain medium 110 on substrate 102 and at least a portion of waveguide 120 on substrate 101. Laser gain medium 110 and waveguide 120 may be adapted for end-transfer (not shown) or transverse-transfer (FIGS. 2A–2E) of optical power therebetween. Substrates 101 and/or 102 are typically adapted for facilitating sufficiently accurate relative positioning of laser gain medium 110 and waveguide 120 for achieving a level of optical power transfer that enables laser oscillation. Waveguide substrate 101 may include one or more additional waveguides and/or other optical structures that form an optical system or subsystem coupled to the semiconductor laser via waveguide 120.

Direct optical power transfer may be employed (not shown) for transferring optical power between laser gain medium 110 and waveguide 120 assembled therewith, or an intermediate external transfer waveguide 130 integrated onto substrate 102 along with gain medium 110 may be employed for transferring optical power between laser gain medium 110 and waveguide 120 (FIGS. 2A–2E). Integrated external transfer waveguide 130 may typically be adapted for end-transfer with laser gain medium 110, and for transverse-transfer (mode-interference-coupled or substantially adiabatic) with waveguide 120, and forms a portion of the composite laser resonator. Descriptions set forth hereinabove pertaining to external transfer waveguide 130' end-coupled at end face 112 and transverse-coupled to waveguide 120' (as in FIGS. 1D and 1E) may also apply to external waveguide 130 end-coupled at end face 111 and transverse-coupled to waveguide 120 (FIGS. 2A–2E), and need not be repeated.

The laser gain medium 110 and waveguides 120 and 130 (including waveguide grating segment 140) comprise at least a portion of a composite laser optical resonator, with waveguide grating segment 140 acting as one resonator end mirror. FIGS. 2A–2E illustrate schematically various manners in which the second resonator end mirror may be provided, each analogous to a corresponding one of FIGS. 2I–1E. Descriptions set forth hereinabove pertaining to end face 112, waveguide 120', end face 121', waveguide grating segment 140', and/or external transfer waveguide 130' (as in FIGS. 1A–1F) may also apply to those elements as shown in FIGS. 2A–2E, and need not be repeated. Laser output may be transmitted through any of grating waveguide segment 140, end face 112 (in the absence of waveguide 120'), end face 121' (if present), and waveguide grating segment 140' (if present), as described hereinabove for FIGS. 1A–1F.

Whichever of the exemplary embodiments of a grating-stabilized semiconductor laser is implemented (FIGS. 1A–1F and 2A–2E), various adaptations and mechanisms may be employed for modifying, controlling, and/or stabilizing the spectral properties of the laser output. Various of these are described hereinbelow.

For frequency stabilization of a single-longitudinal-mode semiconductor laser, the spectral width of the reflectivity provided by waveguide grating 140 is preferably high enough to sustain laser oscillation in the composite laser resonator only over a wavelength range no wider than about twice the longitudinal mode spacing of the composite laser resonator, typically substantially narrower. If this condition is met, then only one or two longitudinal modes of the composite laser resonator will typically support laser oscillation, usually only one if the longitudinal mode frequency is centered with respect to the waveguide grating spectral profile. Two complications arise, however, in the implementation of this scheme for achieving single-longitudinal-mode oscillation. First, both the wavelength dependence of the waveguide grating reflectivity and the wavelengths of the composite resonator longitudinal modes vary with temperature, with differing temperature dependences. As the operating temperature of the semiconductor laser changes, the laser is likely to abruptly shift from one longitudinal mode to another as the grating reflectivity and longitudinal mode spectrum shift relative to one another. This in turn leads to undesirable fluctuations in laser output power and/or wavelength, fluctuations in pulse transit times through optical fiber (due to fiber dispersion), fluctuations in modulation bandwidth, and/or other difficulties. These problems have been at least partially mitigated in prior semiconductor laser devices by incorporating a temperature-dependent compensator into the laser resonator, usually in a portion of the waveguide 120 or 130 (if present) between the semiconductor laser 110 and the waveguide grating segment 140 (as in U.S. Pat. No. 6,320,888, in which a polymer-based compensator is employed). The temperature dependence of the compensator optical properties are engineered so as to nearly match the temperature dependence of the longitudinal mode wavelength to the temperature dependence of the waveguide grating reflectivity spectral profile. Any optical material or combination of materials may be employed that yield a suitable temperature dependence of the longitudinal mode wavelength. A laser thus adapted may operate over a significantly broader temperature range without unwanted mode hops, as the longitudinal mode wavelength and grating wavelength track substantially together.

The second, and potentially more troublesome, complication arises from the difficulty in matching the grating reflectivity spectral profile to a longitudinal mode wavelength supported by the composite resonator. While the spectral characteristics of the waveguide grating my be tightly controlled using lithography and/or other precision material processing techniques during fabrication, it is virtually impossible to target a specific longitudinal mode wavelength during fabrication of the composite laser resonator. Consequently, it is likely that a longitudinal mode will not be well-centered with respect to the waveguide grating reflectivity, or the waveguide grating reflectivity may even span adjacent longitudinal modes. Either of these occurrences are detrimental to the performance of the single-longitudinal-mode semiconductor laser. A temperature-dependent compensator as described in the preceding paragraph may be employed to mitigate this problem as well. Adjusting the temperature of the compensator enables shifting of the longitudinal mode wavelengths and alignment of one of those wavelengths with the grating reflectivity. However, as the ambient temperature changes and/or laser components age, this spectral alignment is likely to be lost without active feedback control. Other mechanisms may be employed for actively controlling longitudinal mode wavelengths of the composite laser resonator as well. One such mechanism includes injection of varying amounts of current through a localized portion of the resonator comprising a semiconductor waveguide. Current thus injected may alter the index of the localized portion of the semiconductor waveguide, thereby altering the longitudinal mode wavelengths of the composite resonator. Other mechanisms for controlling the longitudinal mode wavelengths may be equivalently employed. Whatever method is employed for controlling longitudinal mode wavelengths, some form of active feedback (including generation of an appropriate error signal) is typically required for locking a longitudinal mode wavelength to the waveguide grating spectral profile over the lifetime of the laser and over a range of ambient operating conditions.

Exemplary embodiments of grating-stabilized semiconductor lasers including feedback control are shown schematically in FIGS. 3–7. It shall be understood that the adaptations illustrated in FIGS. 3–7 may be implemented for any of the embodiments of FIGS. 1A–1F and 2A–2E, even though FIGS. 3–7 only show an embodiment similar to FIG. 1A. Semiconductor laser 110 and optical waveguide 120 are positioned/adapted for optical power transfer therebetween in any of the ways described hereinabove. Waveguide grating segment 140 serves as an output coupler and wavelength-selective component for the resulting composite laser resonator. Optical waveguide 120 may be provided with a compensator 250, positioned in, on, or near a portion of waveguide 120 (or waveguide 120' or 130 or 130', if present) within the semiconductor laser resonator. Such a compensator typically operates by altering a modal index of a portion of the waveguide, thereby altering the longitudinal mode wavelengths of the laser resonator. The compensator should be positioned so as not to affect the waveguide grating segment 140 (or 140') if alteration of grating spectral properties is not desired. Compensator 250 may comprise a thermo-optic element with a control heating element provided therefor. Compensator may comprise a current-dependent semiconductor optical element with a control current source provided therefor. Compensator 250 may comprise an electro-optic element and a control voltage source therefor. Compensator 250 may comprise a non-linear-optical element and a control optical source therefor. Compensator 250 may include a multi-layer-reflector dispersion-engineered waveguide structure (as set forth in U.S. application Ser. No. 10/037,966) and a control voltage source therefor. Other compensators and corresponding control elements may be equivalently employed. Such compensators and the corresponding control elements enable adjustment of a laser resonator longitudinal mode wavelength and alignment of the same with the reflectivity spectral profile of waveguide grating segment 140.

Figure 3:
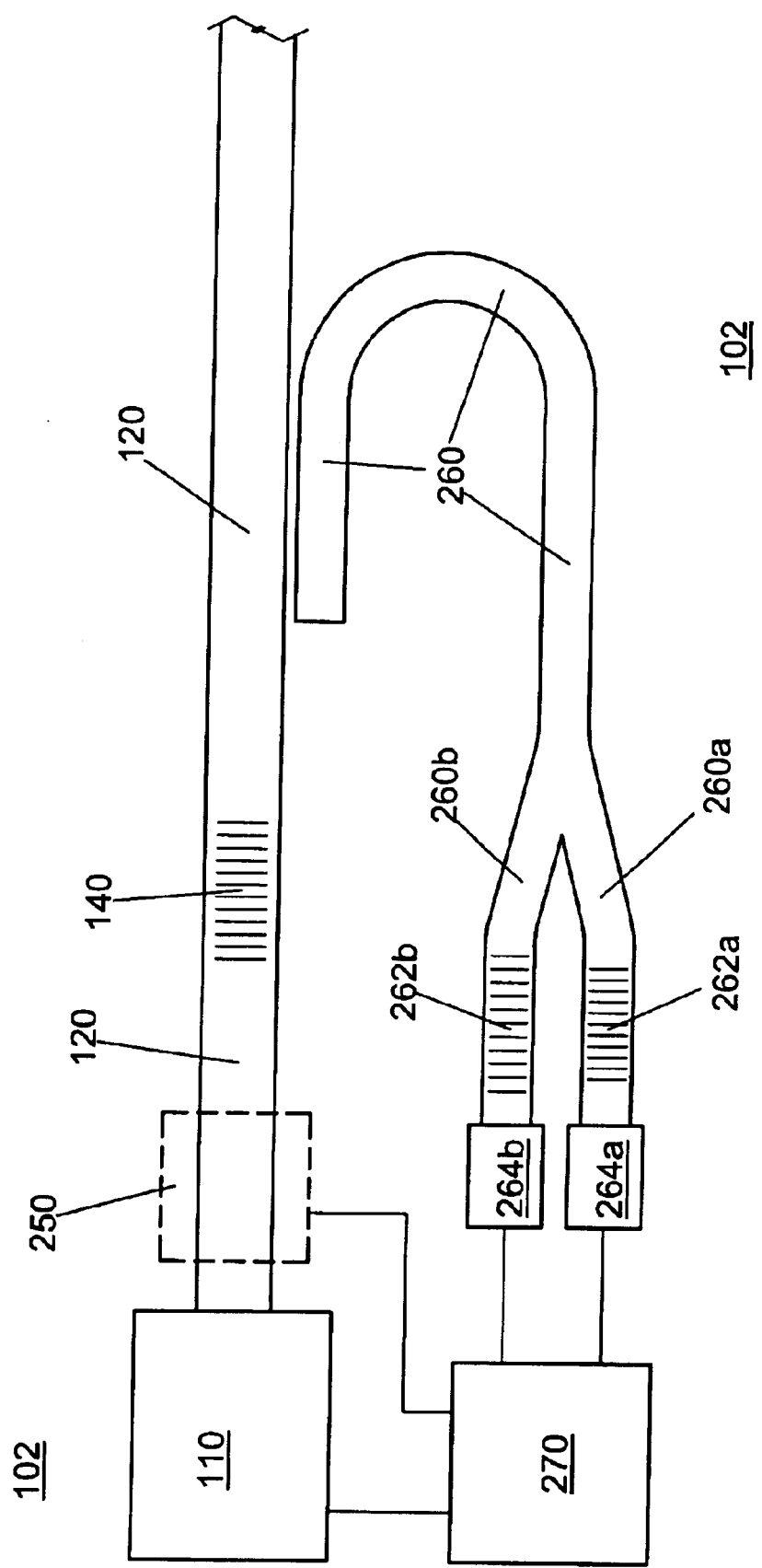
FIG. 3 is a schematic top view of an exemplary single-longitudinal-mode grating-stabilized semiconductor laser.

The semiconductor laser is further provided with a pair of secondary optical waveguides 260a and 260b, each provided with a respective reference waveguide grating segment 262a and 262b. As shown in FIG. 3, each of reference waveguides 260a and 260b is a branch of a waveguide 260 positioned and adapted at its proximal end for transfer of a constant fraction of the output power of the semiconductor laser from optical waveguide 120 into each of waveguides 260a/260b. This transfer may be most readily achieved by transverse-transfer of optical power between waveguide 120 and waveguide 260, with waveguides/segments 260/260a/260b/262a/262b formed on the same substrate as waveguide 120 (on semiconductor substrate 102 for the embodiments of FIGS. 1A–1F; on waveguide substrate 101 for the embodiments of FIGS. 2A–2E). Other locations for waveguides/segments 260/260a/260b/262a/262b may be employed, including locations on a substrate other than the substrate of waveguide 120 (requiring assembly for establishing optical power transfer and feedback control). The transverse-transfer may be substantially adiabatic or substantially modal-index-matched mode-interference-coupled. Other mechanisms for transferring a portion of the laser output power from waveguide 120 to waveguide 260 may be equivalently employed, including provision of a branch of waveguide 120 to serve as waveguide 260 (not shown), the branch point being configured for providing the desired substantially constant fraction of optical power transfer.

Figure 4:
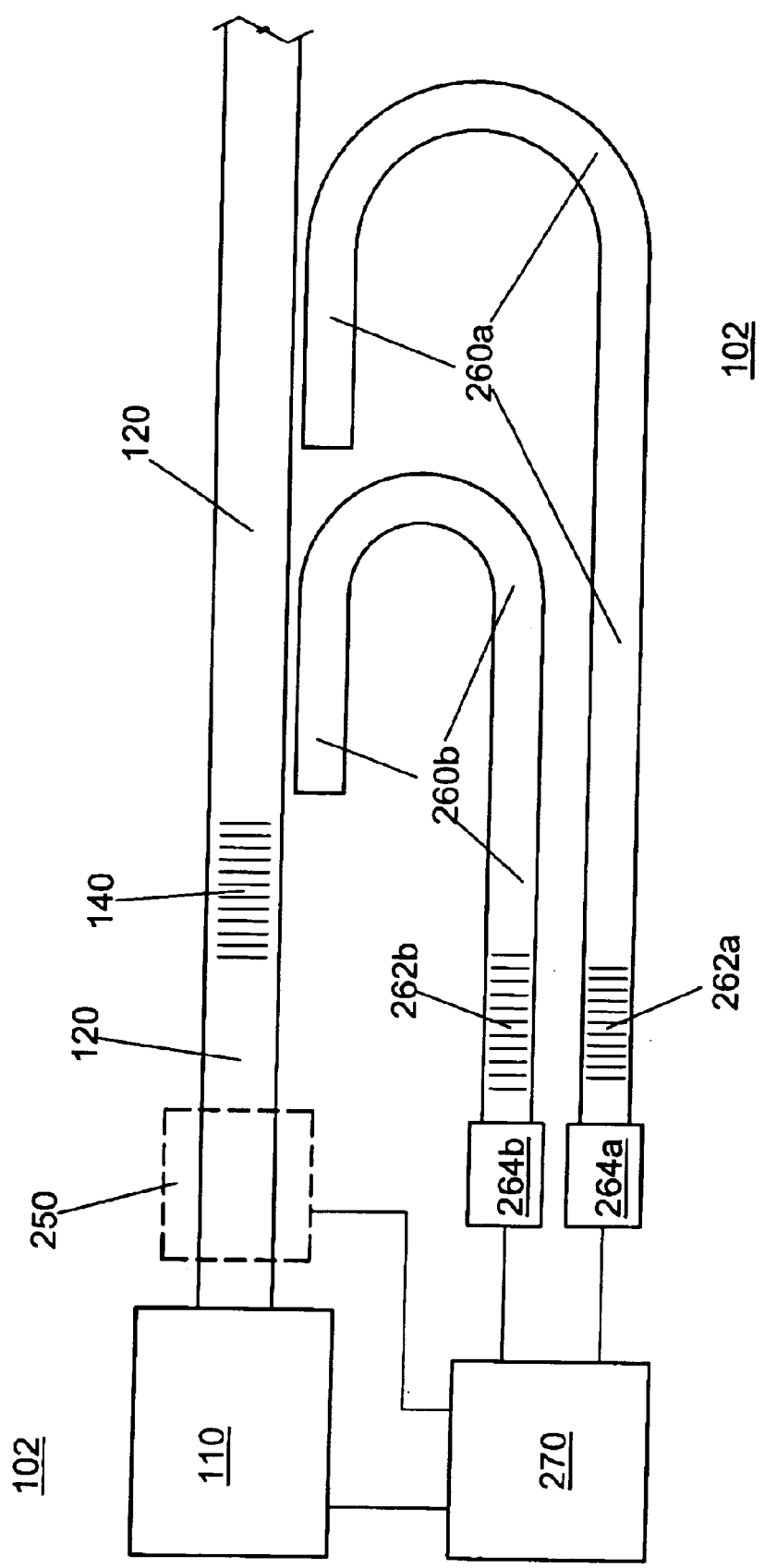
FIG. 4 is a schematic top view of an exemplary single-longitudinal-mode grating-stabilized semiconductor laser.
Figure 5:
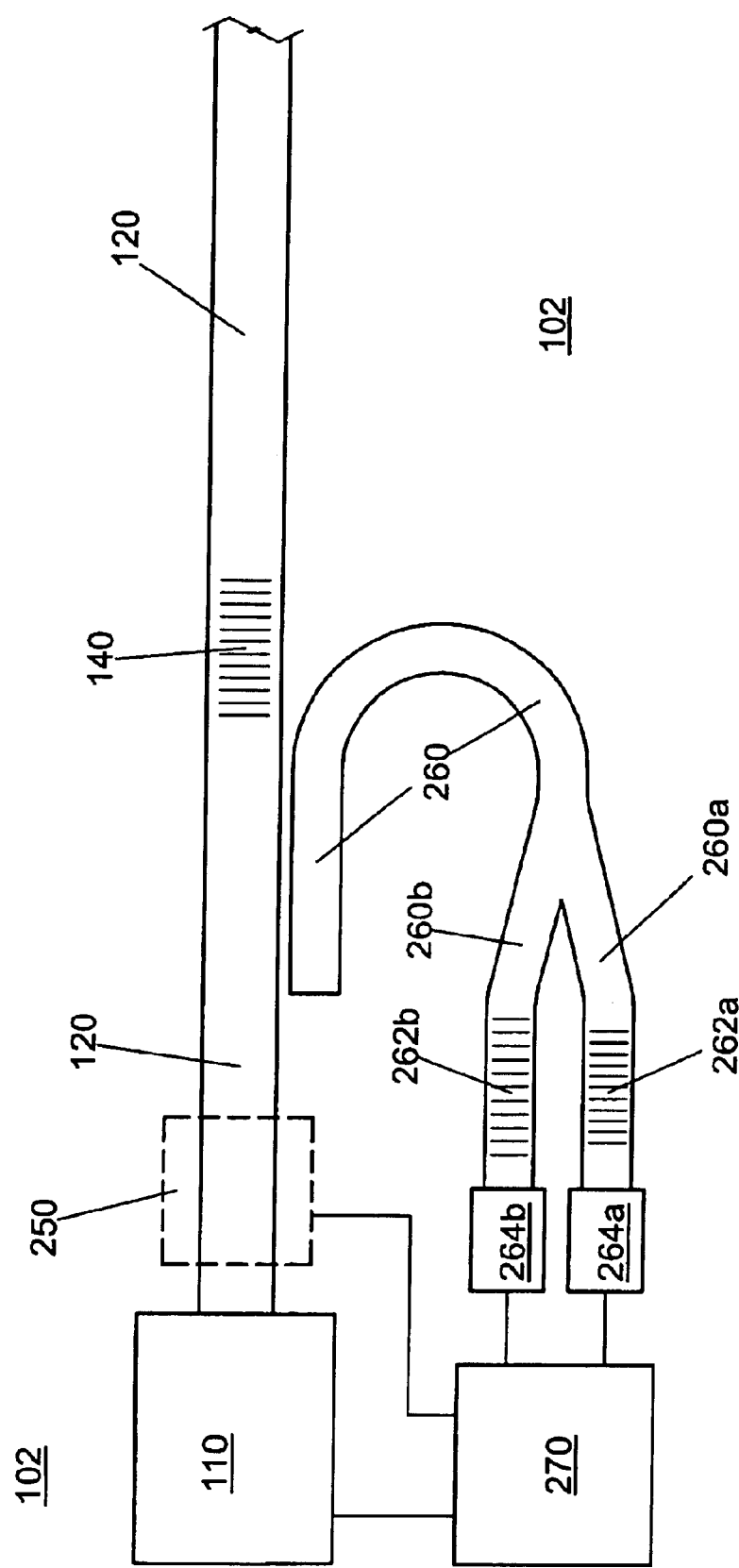
FIG. 5 is a schematic top view of an exemplary single-longitudinal-mode grating-stabilized semiconductor laser.
Figure 6:
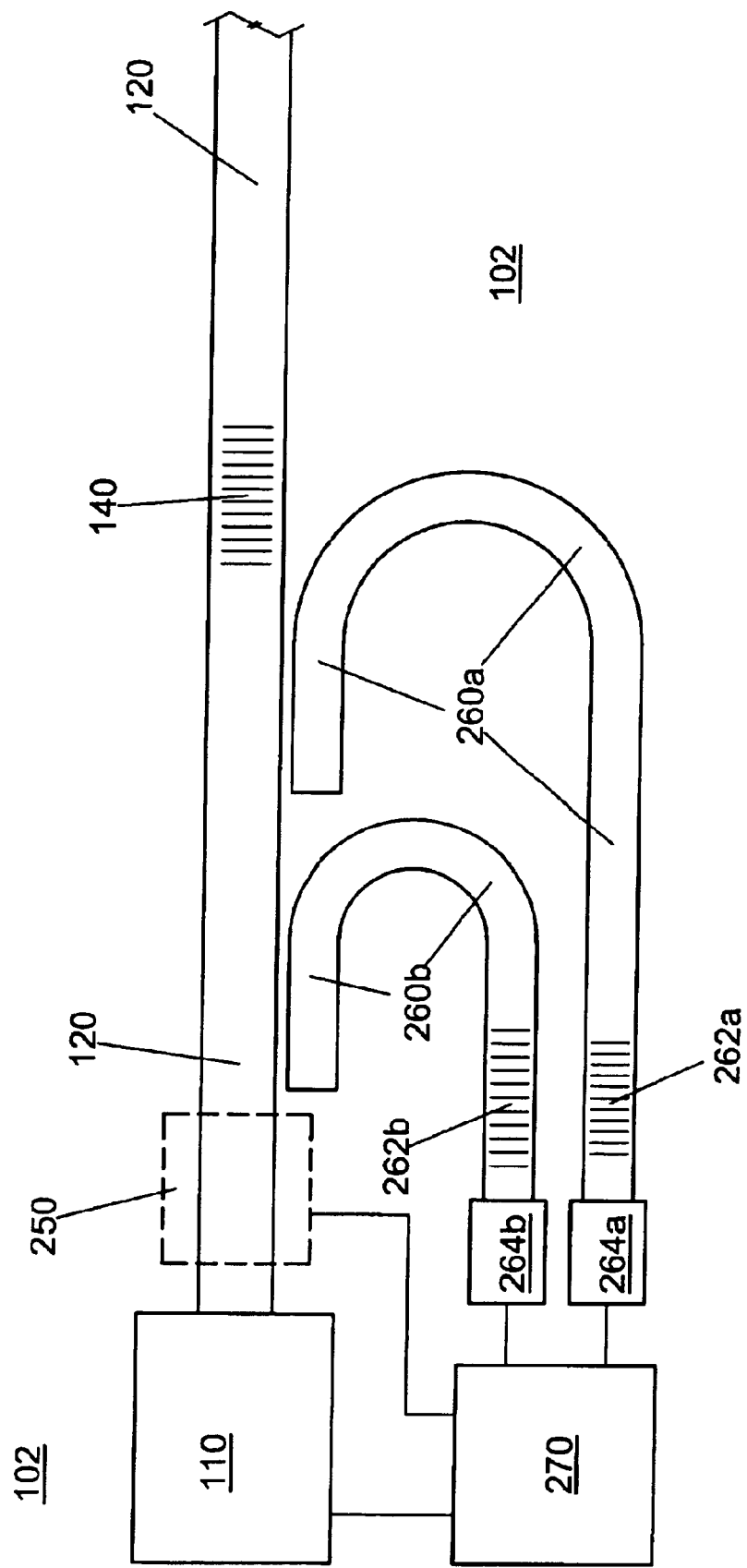
FIG. 6 is a schematic top view of an exemplary single-longitudinal-mode grating-stabilized semiconductor laser.
Figure 7:
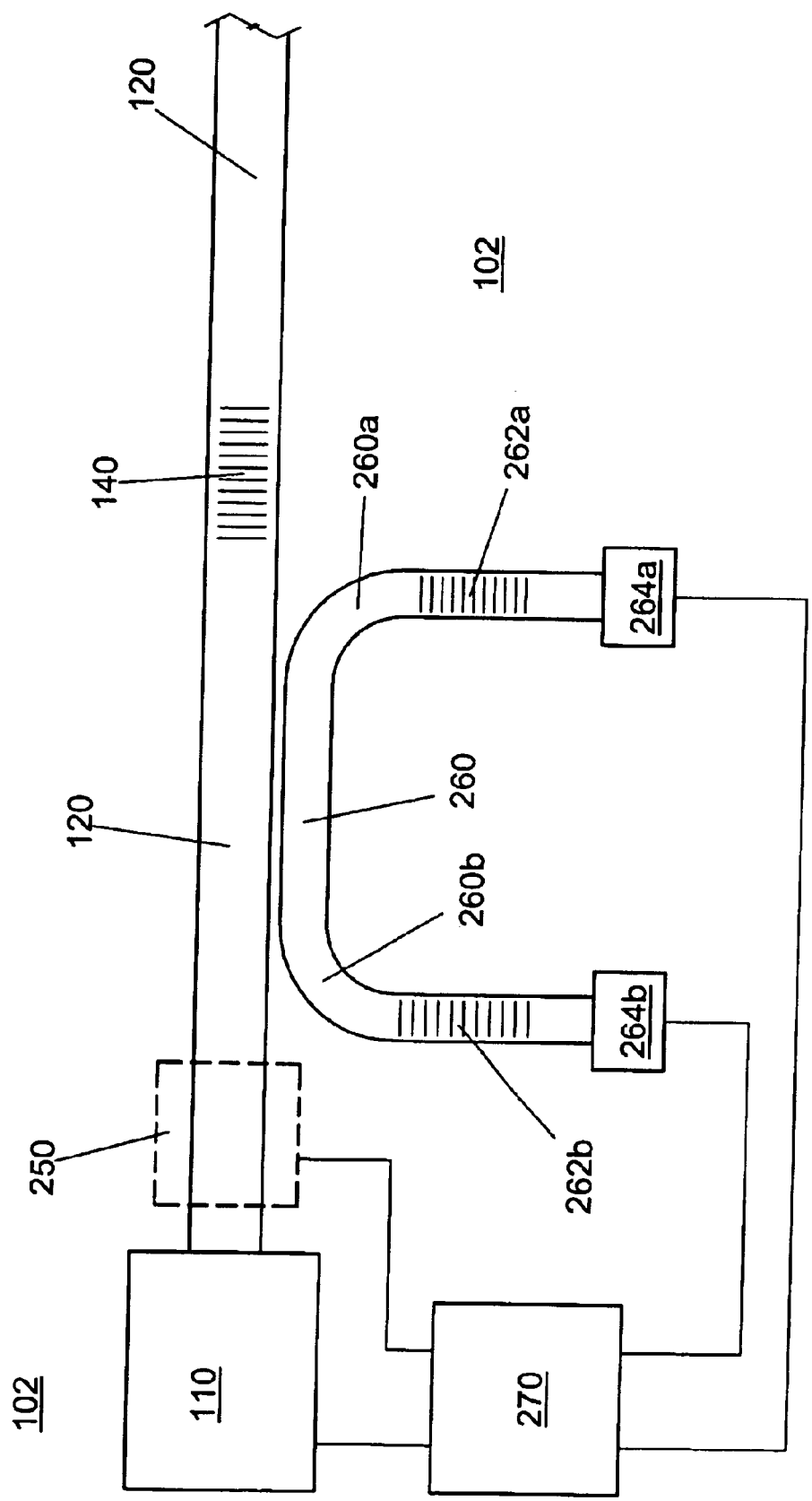
FIG. 7 is a schematic top view of an exemplary single-longitudinal-mode grating-stabilized semiconductor laser.

Various configurations for laser 110, waveguide 120, waveguide grating segment 140, waveguide(s) 120'/130/130' (if present), and waveguides/segments 260/260a/260b/262a/262b may be employed. In FIG. 3, optical power is transferred from waveguide 120 into waveguide 260 (and hence to waveguides 260a/260b) from a portion of waveguide 120 beyond waveguide grating segment 140. In FIG. 4, waveguides 260a/260b are shown separately coupled to waveguide 120 at portions beyond waveguide grating segment 140. FIGS. 5 and 6 are analogous to FIGS. 3 and 4, respectively, with the reference waveguide(s) coupled to waveguide 120 before waveguide grating segment 140 and transferring a portion of the intracavity laser power to waveguides 260a/260b. If coupled within the composite laser resonator, a single waveguide 260 may be employed with reference waveguides 260a/260b provided at the two ends (FIG. 7), since optical power propagates in both directions within the composite laser resonator. Typically less than about 5% of the output power propagating through waveguide 120 (beyond waveguide grating segment 140), perhaps as much as about 10%, is diverted to waveguides 260a/260b. When transferred from waveguide 120 at a portion before waveguide grating segment 140, a correspondingly smaller fraction of the optical power may be transferred from within the composite laser resonator where optical power levels would typically be higher. If the amount of optical power directed to waveguides 260a/260b is too small, insufficient error signal levels would be generated for stabilizing the laser (as disclosed hereinbelow). If the amount of optical power directed to waveguides 260a/260b is too large, waveguide 120 would be too lossy, and/or undesirable optical feedback and/or interference may result (particularly when the optical power is transferred from within the composite laser resonator). Some experimentation may be required for determining an operationally acceptable level of optical power transfer to waveguides 260a/260b for a particular combination of semiconductor laser gain medium 110, particular configuration of the semiconductor laser and waveguide(s) 120 and 120'/130/130' (if present), particular reference photodetectors employed (described further hereinbelow), and so forth. It may be desirable to provide some degree of optical isolation between the laser and the reference waveguide gratings segments 262a/262b, so as to reduce feedback and/or interference from light reflected from the reference waveguide grating segments.

Figure 8A:
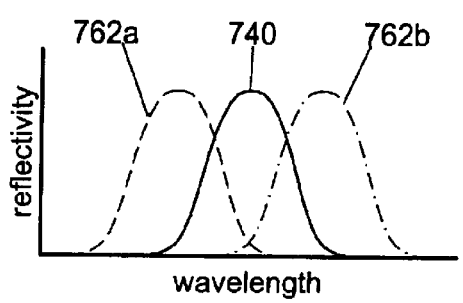
FIGS. 8A and 8B are graphs showing waveguide grating reflectivity profiles, photodiode signals, and an error signal.
Figure 8B:
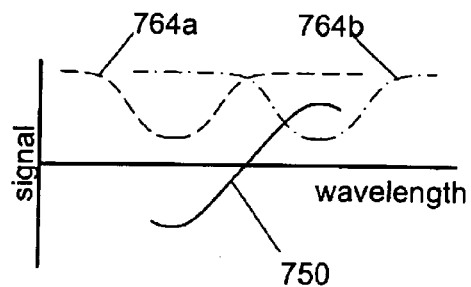

As shown in FIGS. 3 through 7, each of reference optical waveguides 260a/260b is provided at an intermediate portion thereof with a corresponding reference waveguide grating segment 262a/262b. The wavelength dependent reflectivity of the reference waveguide grating segment 262a is blue-shifted from the reflectivity of waveguide grating 140, while the wavelength-dependent reflectivity of reference waveguide grating segment 262b is red-shifted from the reflectivity of waveguide grating 140 by a comparable amount. Each of reference optical waveguides 260a/260b delivers, at a distal portion thereof to a corresponding reference photodetector 264a/264b, at least a portion of optical power transmitted through the respective reference grating segment 262a/262b. The wavelength-dependent signals 764a/764b from photodetectors 264a/264b are used to form a wavelength-dependent error signal 750 (a difference or a ratio, for example; FIG. 8B), which in turn serves a feedback signal for controlling the compensator 250 through feedback circuit 270.

If the wavelength-dependent reflectivity profiles 762a/762b of reference waveguide grating segment 262a/262b bracket the reflectivity profile 740 of waveguide grating segment 140 (FIG. 8A), then an error signal (i.e., the difference or ratio signal; difference signal 750 shown in FIG. 8B) can be formed that varies substantially monotonically with wavelength when optical power propagating through optical waveguide 120 is near the reflectivity spectral profile of the waveguide grating segment 140. Any mismatch between the composite laser resonator longitudinal mode and the reflectivity spectral profile of the waveguide grating 140 results in a frequency shift of the lasing wavelength away from the waveguide grating wavelength. By using the error signal for controlling the compensator 250 via feedback circuit 270, the laser resonator longitudinal mode may be shifted back into spectral alignment with the reflectivity profile of waveguide grating 140. In addition to reducing the likelihood of mode hops, this feedback mechanism may also substantially reduce fluctuations in laser output power resulting from temperature-induced spectral mismatch between the laser longitudinal mode and the waveguide grating. Another signal derived from one or both of photodetectors 264a/264b (a sum signal, for example) may be used as a feedback signal for controlling the laser output power (via the laser drive current) through feedback circuit 270.

It should be noted that the dual-reference-waveguide wavelength locking scheme set forth hereinabove is only one example of many ways in which the output wavelength of the semiconductor may be monitored and controlled. Many other types wavelength reference may be equivalently employed, error signals generated in a wide variety of ways, and any one or more of a variety of suitable wavelength control element(s) may be employed. Such control may be implemented for controlling the laser wavelength as required (for suppressing mode hops, for absolute wavelength calibration, for tuning, and so forth). Any suitable wavelength locking scheme and use thereof may fall within the scope of the present disclosure.

Feedback sensitivity, laser output power fluctuations, and/or laser output wavelength shifts for a semiconductor laser may be reduced relative to a single-longitudinal-mode laser by enabling simultaneous laser oscillation of several longitudinal modes (two or more modes above the −20 dB level). Prior Fabry-Perot semiconductor lasers (lacking a waveguide grating segment) typically operate in this regime, with mode spacings of around 1 nm. Fabry-Perot lasers are relatively easier and cheaper to fabricate than their single-longitudinal-mode counterparts. However, the resulting spectral width and/or spectral shifts of the output of prior Fabry-Perot lasers may often be too large for data transmission applications at high data rates or over long fiber optical fiber distances, and the wavelength varies substantially with temperature and/or drive current. It would be advantageous in fiber-optic telecommunications applications to reduce spectral width and/or spectral shifts of a Fabry-Perot semiconductor laser and/or restrict its laser oscillation near a predetermined wavelength while retaining reduced feedback sensitivity, reduced power fluctuations, and reduced manufacturing costs. This may be achieved in the present invention by a Fabry-Perot laser and a waveguide including a waveguide grating segment, the Fabry-Perot laser and waveguide being adapted to form a composite laser resonator, in a manner similar to that described hereinabove.

Such a multiple-longitudinal-mode grating-stabilized semiconductor laser may be configured in any of the ways schematically illustrated in FIGS. 1A–1F and 2A–2E, and may often resemble the embodiment of FIG. 1A. A semiconductor laser gain medium 110 of any suitable type and optical waveguide 120 (including a waveguide grating segment 140) are positioned on substrate 102. A back face 112 of the semiconductor laser 110 serves as one laser resonator mirror (high reflector or output coupler), while the front face 111 may be angled and/or anti-reflection coated or otherwise adapted to substantially suppress laser oscillation in longitudinal modes supported only by the semiconductor laser. Waveguide 120 is positioned and adapted for optical power transfer with laser 110, and waveguide grating segment 140 serves as another resonator mirror (high reflector or output coupler) for the composite laser resonator as well as a spectrally selective element. The spectral position of the waveguide grating reflectivity may be engineered to yield laser oscillation at a desired design wavelength (near the zero-dispersion point of an optical fiber, for example, or at some other desired wavelength).

In contrast to single-longitudinal-mode embodiments, the reflectivity spectral profile of waveguide grating segment 140 may be engineered with sufficient spectral width for enabling laser oscillation in multiple longitudinal modes of the composite resonator (above the −20 dB level, for example). Stated another way, the waveguide grating reflectivity spectral profile and/or the laser longitudinal mode spacing may be engineered so that the grating reflectivity is within about 1% of the peak grating reflectivity simultaneously for two or more longitudinal modes, or within about 0.5% or even less. The sometimes greater overall length of the composite laser resonator, relative to a Fabry-Perot laser without an integrated waveguide, may result in a somewhat decreased mode spacing (perhaps 10–25% reduction, for example), or may be exploited to result in a significantly smaller longitudinal mode spacing (perhaps 0.2 nm or less). In either case, the composite laser resonator may operate at a reduced overall spectral width and/or with reduced wavelength shifts relative to a standard Fabry-Perot laser, by providing near-peak reflectivity simultaneously to multiple modes. Integrated waveguide 120 may be fabricated so as to exhibit optical loss sufficiently small to allow its incorporation into a semiconductor laser resonator.

A composite Fabry-Perot semiconductor laser may be fabricated that is substantially similar in its construction to typical single-longitudinal-mode DFB semiconductor lasers, suitably modified for multiple-longitudinal-mode use as described herein (i.e., broadened spectral reflectivity profile of the grating waveguide reflectivity and/or reduced longitudinal mode spacing). In such a multi-longitudinal-mode DFB laser (or a Fabry-Perot laser with integrated waveguide, as described above), the usual design guideline that the modal gain differential between a single desired oscillating mode and other modes satisfy the relation $\Delta g \cdot L > 0.05$ (where L is the resonator length, and $\Delta g$ is the differential gain/loss) is deliberately violated for multiple oscillating laser resonator modes.

Figure 9A:
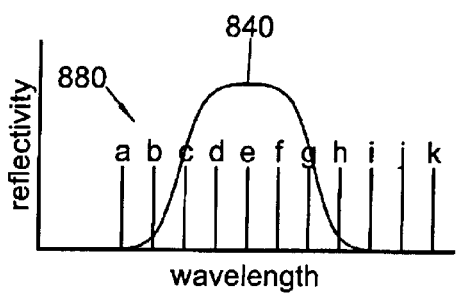
FIGS. 9A and 9B are graphs showing a waveguide grating reflectivity profile and laser longitudinal modes.

As the temperature, drive current, and/or other operating conditions vary and move the longitudinal mode wavelengths, the laser output remains multiple-longitudinal-mode and restricted to a desired wavelength range determined by the waveguide grating segment, even as the longitudinal modes 880 "walk across" the waveguide grating segment reflectivity spectral profile 840 (FIGS. 9A and 9B) as the longitudinal mode frequencies shift with temperature and/or drive current. In FIG. 9A longitudinal modes 880*c*–880*g* may have sufficient grating reflectivity to support laser oscillation, while in FIG. 9B longitudinal modes 880*e*–880*i* may have sufficient reflectivity to support laser oscillation. In either case, however, the output of the laser remains within the spectral width defined by grating reflectivity profile 840. The waveguide grating wavelength may vary with temperature, shifting the output wavelength of the composite Fabry-Perot laser, but at a substantially slower rate (typically around 0.01 nm/° C. to 0.05 nm/° C.) compared to a Fabry-Perot semiconductor laser without waveguide grating stabilization (typically around 0.5 nm/° C.) or compared to a typical semiconductor DFB laser (typically about 0.1 nm/° C.).

Alternatively, it may be the case that in FIG. 9A that laser oscillation occurs only in mode 880*e*. As the longitudinal modes shift and "walk across" the grating reflectivity profile mode 880*f* eventually achieves a grating reflectivity exceeding that of mode 880*e*, and the laser output shifts from mode 880*e* to mode 880*f*. Continued shifting of the longitudinal mode wavelengths may result an another shift of laser oscillation from mode 880*f* to mode 880*g*, and so on. If modes 880*e* and 880*f* (or other adjacent mode pairs) are each within about 1% (or 0.5%) of the peak reflectivity of waveguide grating segment 120, then the power fluctuation that may accompany shifting of the longitudinal mode wavelengths relative to the grating wavelength are small relative to those typically observed for laser considered "single-mode". If the mode spacing is significantly reduced relative to such single-mode lasers, wavelength shifts (within the width of the reflectivity profile) may be reduced as well.

A multiple-longitudinal-mode composite Fabry-Perot semiconductor laser including a waveguide grating for frequency stabilization as described in the preceding paragraphs offers several advantages over standard Fabry-Perot semiconductor lasers (i.e., those lacking a waveguide grating segment) and over typical single-longitudinal-mode DFB semiconductor lasers. A composite Fabry-Perot semiconductor laser with a waveguide grating may be employed at higher data rates and/or over longer optical fiber distances (relative to standard Fabry-Perot lasers), owing to its reduced spectral width/fluctuations and reduced temperature coefficient (determined primarily by waveguide grating properties instead of semiconductor laser properties). The waveguide grating wavelength (and hence the laser output wavelength) may be accurately and precisely determined during fabrication, thereby enabling laser operation at/near a desired output wavelength (such as near an optical fiber zero-dispersion point, for example). Multiple-longitudinal-mode operation renders the composite Fabry-Perot semiconductor laser less sensitive to optical feedback than typical single-longitudinal-mode DFB semiconductor lasers, for example. Higher output coupler reflectivity and longer overall laser resonator length may also render the composite multiple-longitudinal-mode semiconductor laser less sensitive to optical feedback. Output power fluctuations and/or output wavelength shifts that may occur as mode wavelengths shift are reduced relative to single-mode lasers.

Typical fabrication yields for composite Fabry-Perot semiconductor lasers (including integrated waveguides) are often greater than typical yields for DFB semiconductor lasers. A composite Fabry-Perot laser as described herein may be implemented in any of the ways shown in FIGS. 1A–1F and 2A–2E. Waveguide(s) integrated onto substrate 102 may typically comprise low-index materials substantially differing from laser gain medium 110, or may instead comprise semiconductor materials (the same or similar materials as those used to form gain medium 110).

A grating-stabilized semiconductor laser as disclosed herein, either single-longitudinal-mode or multiple-longitudinal-mode, may be implemented in myriad different ways while remaining within the scope of the present disclosure, including those illustrated in FIGS. 1A–1F and 2A–2E. The semiconductor laser gain medium 110 may comprise any suitable semiconductor-based optical gain medium operating at any available desired wavelength, including visible, near-IR, and mid-IR wavelengths. Similarly, waveguide(s) 120/120'/130/130' may be provided in any suitable type and in any suitable configuration, and optical power transfer between semiconductor laser 110 and waveguide 120 may be effected in any suitable manner, including direct end transfer, direct transverse transfer, end transfer to an external transfer waveguide, or transverse-transfer to an external transfer waveguide. Semiconductor laser gain medium 110 and waveguide 120 may be provided as initially separate components and assembled/aligned for optical power transfer therebetween, or may be fabricated on a common substrate and aligned using precision spatially selective material processing techniques.

Suitable waveguide types for waveguides 120/120'/130/130' and/or 260/260*a*/260*b* may include planar optical waveguides of various sorts as set forth hereinabove and in the above-cited prior applications. Waveguides may be polarization dependent or independent as needed for a particular device. Grating waveguides may be provided by any suitable spatially-selective material processing techniques that enables suitably precise periodic index modulation (bulk index and/or modal index) of the relevant waveguide structure. Such techniques may include masked, holographic, and/or direct-write techniques, including irradiative densification, doping, implantation, photo-chemical or photo-physical alteration, photoresist techniques, wet- or dry-etching, machining, deposition, and so forth. Such techniques may be implemented sufficiently accurately, for example, to enable accurate production of a desired design wavelength, and/or to enable precise bracketing of a grating wavelength for waveguide grating segment 140 and/or 140' by the grating wavelengths for waveguide gratings 262*a*/262*b*. Waveguide grating segments may be first-order (grating period of $\lambda/2n_{eff}$) or higher-order (grating period an integer multiple of $\lambda/2n_{eff}$). First-order waveguide gratings may offer the highest grating reflectivity, but require smaller grating periods and may be therefore more difficult to fabricate. Higher order gratings, such as second- or third-order gratings, have larger grating periods and may be therefore more readily fabricated, but may exhibit insufficient reflectivity and/or excessive optical loss for use in some semiconductor laser applications. A portion of the light incident on a higher-order waveguide grating may be diffracted out of the waveguide by lower grating orders.

Figure 10A:
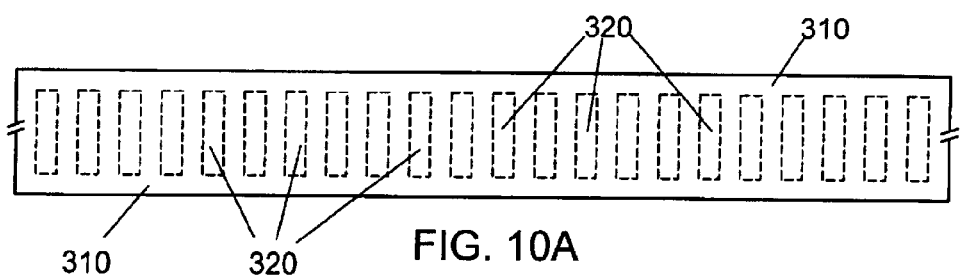
FIGS. 10A, 10B, and 10C are schematic top views of exemplary waveguide gratings.
Figure 10B:
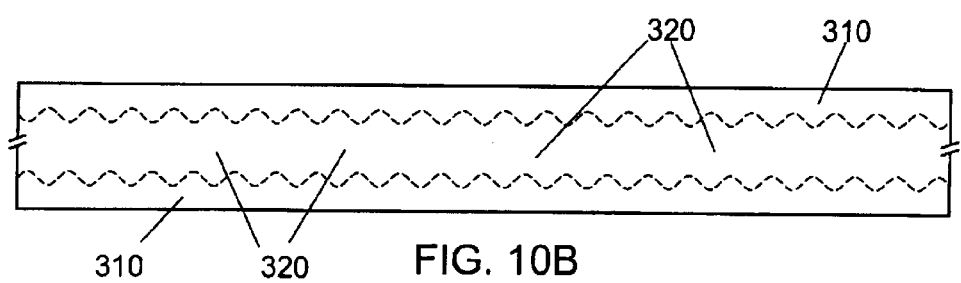
Figure 10C:
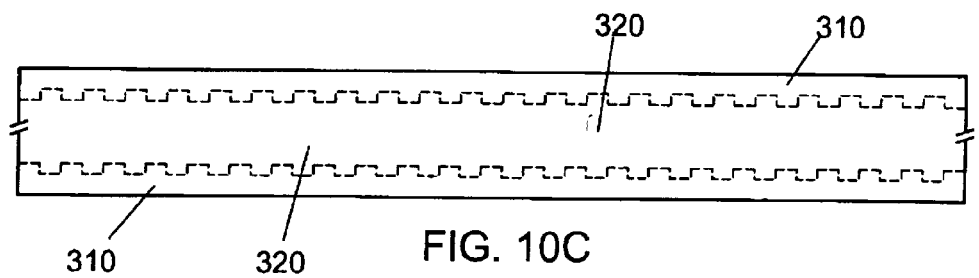
Figure 11A:
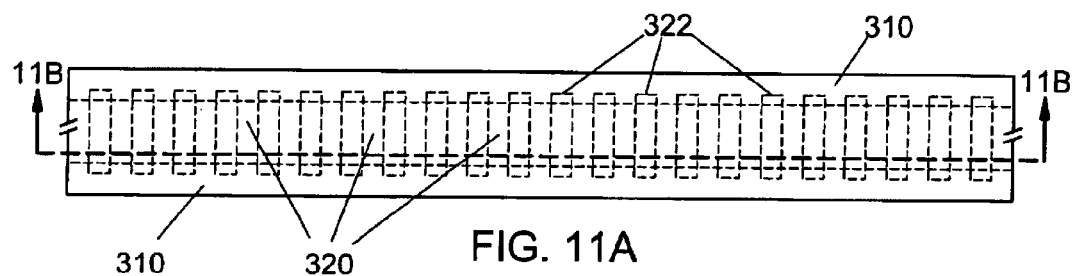
FIGS. 11A and 11B are schematic top and side views, respectively, of an exemplary waveguide grating.
Figure 11B:
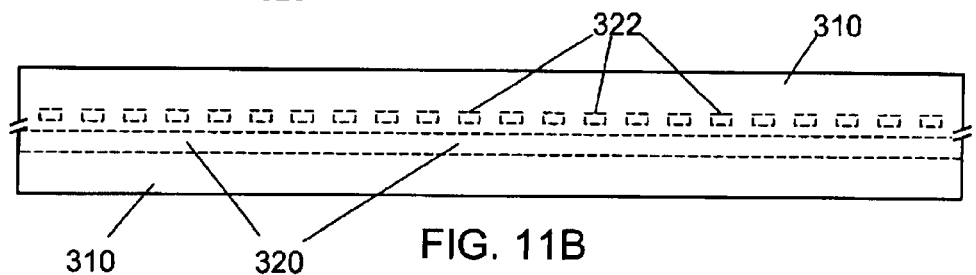

Waveguides having a thin silicon nitride or silicon oxynitride core 310 (tens or a few hundreds of nm thick and several $\mu$m wide) within silica or silica-based cladding 320 are suitable for implementing the present invention. The modal index may be readily modulated by spatially-selective removal of transverse segments of the core 320 (FIG. 10A), or by providing the core 320 with stepped, corrugated, or undulating edges (FIGS. 10B and 10C). These core configurations may be implemented in waveguides having relatively thick (several $\mu$m) cores as well. Although grating period, amplitude, and duty cycle are shown not varying along the length of the grating, one or more of these properties may vary longitudinally (according to a suitable apodization function) for providing desired spectral characteristics. Another embodiment for a waveguide grating segment is shown in FIGS. 11A and 11B. In this example the main core 320 of the waveguide is a thin silicon nitride or silicon oxynitride embedded within a silica or silicabased cladding 310 (as described above). A second thin silicon nitride or silicon oxynitride layer 322 is provided above (or below) the core 320, sufficiently close so that its presence affects the modal index of a propagating mode guided by core 320. Spatially selective removal of transverse segments of the second layer 322 yields a waveguide grating for the propagating optical mode. The overall strength of the grating (i.e., its reflectivity) may be determined by the thickness, width, and/or duty cycle of the layer 322 (either or both of which may vary along the length of the grating waveguide segment), providing additional design parameters for enabling producing waveguide grating segments of arbitrarily designed spectral properties.

It may be desirable to configure a grating-stabilized semiconductor laser according to the present invention with waveguide grating segments 140 and 262a/262b as close to each other as practicable on a common substrate (on semiconductor substrate 102 for embodiments of FIGS. 1A–1F; on waveguide substrate 101 for embodiments of FIGS. 2A–2E). In this way effects of any spatial non-uniformities of the substrate and/or waveguide fabrication may be minimized. Alternatively, it may instead be desirable to provide reference waveguide segments 262a/262b on a substrate separate from waveguide grating segment 140. Photodetectors 264a/264b may be of any suitable type, including photodiode detectors. Photodetectors 264a/264b (i) may be integrated directly onto a substrate with waveguides 262a/262b; (ii) may be mounted on the substrate (flip-chip or otherwise) for end-coupling to waveguides 262a/262b; (iii) may be mounted (flip-chip or otherwise) over suitably adapted distal portions of waveguides 260a/260b (i.e., suitably adapted for transversely directing at least a portion of the optical power, by reflecting, scattering, and/or other means); or (iv) each photodetector may be provided with its own external-transfer waveguide on a photodetector substrate and mounted (flip-chip or otherwise) for transverse-transfer of optical power from waveguides 260a/260b. Other arrangements and/or configurations for coupling optical power from reference waveguides 260a/260b into respective photodetectors 264a/264b may be equivalently employed.

In a single-longitudinal-mode embodiment, any suitable feedback circuit may be employed for receiving signals from photodiodes 264a/264b and providing an error signal for feedback control of the compensator 250, or a feedback signal for control of the laser output power. Any such circuit may include analog and/or digital components, and may provide any array of amplifier/attenuator, comparator, integrator, differentiator, filter, heater or other compensator driver, gain, and/or other functionalities required to accurately and stably provide feedback control for the heating element (or other compensator). In particular, differences in the amounts of optical power sent to the two photodetectors, differences in the spectral profiles of the reference waveguide gating segments, differences in detector efficiency, and so on may be compensated in a feedback controller to yield the desired feedback characteristics. These various embodiments and/or adaptations for the feedback circuit nevertheless fall within the scope of the present disclosure.

Figure 12:
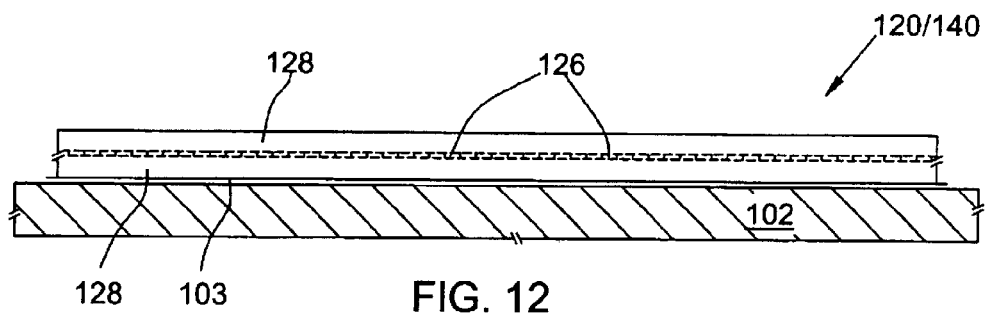
FIG. 12 is a schematic side view of an exemplary waveguide grating.

Waveguide grating segments employed as disclosed herein may be further adapted for reducing optical loss into an underlying substrate (a semiconductor substrate 102 or a waveguide substrate 101). FIG. 12 shows an optical waveguide with a waveguide grating segment (waveguide 120 on substrate 102 with waveguide grating 140 in this example; similar adaptations may be implemented for a waveguide 120' with waveguide grating segment 140', or for a waveguide on a separate waveguide substrate 101). Waveguide 120 includes a core 126 and cladding 128. The waveguide grating segment 140 is formed in this example by periodic alteration of core 126. A thin metal coating 103 is provided between the substrate 102 and the waveguide 120 thereon, thereby preventing leakage of light propagating along waveguide 120 into substrate 102. If waveguide grating segment 140 is a second-, third-, or higher-order grating, then lower diffracted orders are diffracted in directions having non-zero transverse components. These (typically) unwanted diffracted orders represent optical loss, with the diffracted light propagating upward and out of the waveguide 120 or downward into substrate 102. However, if a metal layer 103 is present, then lower-order light diffracted downward is reflected from metal layer 103 and redirected away from the substrate and back upward through the lower cladding through the core 126 of the waveguide grating segment. The core, cladding, and metal reflector may be configured so as to result in destructive interference between the upwardly-reflected light and upwardly-diffracted light of the same diffracted order, thereby suppressing or substantially eliminating optical loss due to the unwanted lower-order diffraction. Even if the destructive interference is not substantially complete, the unwanted diffracted orders may nevertheless be substantially reduced by the presence of metal reflective layer 103. Any suitable reflective layer (metal, multi-layer, or other suitable reflector) may be equivalently employed between a waveguide grating segment and an underlying substrate for suppressing unwanted lower diffracted orders.

Various additional adaptations may be employed for implementing grating-stabilized semiconductor lasers as disclosed herein. Many modifications and adaptations related to waveguide(s) 120, 120', 130, and/or 130' integrated onto semiconductor substrate 102 for end-transfer with semiconductor laser gain medium 110 are disclosed in earlier-cited application Ser. Nos. 60/442,288 and 60/462,600 and need not be repeated here. Any of the optical structures, adaptations thereof, and/or fabrication methods therefor disclosed therein may be implemented for providing grating-stabilized semiconductor lasers within the scope of the present disclosure. Such structures and adaptations may include, but are not limited to, reflectivity or suppression thereof at end face(s) of the gain medium, reflective or anti-reflective coatings between gain medium 110 and a waveguide integrated therewith, angled and/or curved end face(s) of gain medium 110, adaptations for reducing optical loss at the junction between the gain medium and an integrated waveguide, coatings between the integrated waveguide(s) and the semiconductor for reducing optical losses, and so on.

An anti-reflection coating may be provided on end face 111 (or 112, if appropriate) of laser gain medium 110 for suppressing laser oscillation in unwanted longitudinal modes. Substantial reduction or elimination of such reflectivity may also be necessary for avoiding unwanted perturbations of the spectral reflectivity properties of the waveguide grating, and for enabling accurate design and implementation of a center wavelength, spectral profile, and overall reflectivity of the waveguide grating. Such reduction or elimination of reflectivity may be particularly necessary when low-index materials are employed for forming integrated waveguide(s) end-coupled to the laser gain medium through an end face. In an illustrative example, reflectivity at an uncoated interface between silica-based material (n=1.45) and III–V semiconductors (n=3.2) results in reflectivity of about 14%. Application of a λ/4 layer of silicon nitride therebetween (n≈2) may reduce this reflectivity to below about 1%. The presence of 0.5% reflectivity in this example results in a noticeable dependence of the effective grating reflectivity on the effective end-face-to-grating distance (for a given wavelength; trace 1301 of FIG. 13A; 80% grating reflectivity in this example), while 14% end face reflectivity in this example results in a major perturbation of the effective grating reflectivity as a function of effective end face to grating distance (trace 1302 of FIG. 13A; 80% grating reflectivity in this example). Analogous behaviors are observed for other reflectivity levels for the end face and/or grating.

The length dependence arises from interference between light reflected from the semiconductor end face and light reflected from the grating. If these are in phase, the effective reflectivity is a maximum, and larger than the grating reflectivity alone (in this example, about 82% for 0.5% end face reflectivity; about 90% for 14% end face reflectivity); if they are out of phase, the effective reflectivity is a minimum, and smaller than the grating reflectivity alone (in this example, about 77% for 0.5% end face reflectivity; about 61% for 14% end face reflectivity. Between these extremes of the relative phase, the effective reflectivity varies monotonically. Perhaps more significant from an operational standpoint, at an intermediate relative phase, the spectral profile of the effective reflectivity (end face plus grating) is shifted from the grating design wavelength by an amount (usually a few nm at 1500 nm) that depends on the phase difference (i.e., on the effective optical path length between the waveguide grating and the end face).

Figure 13A:
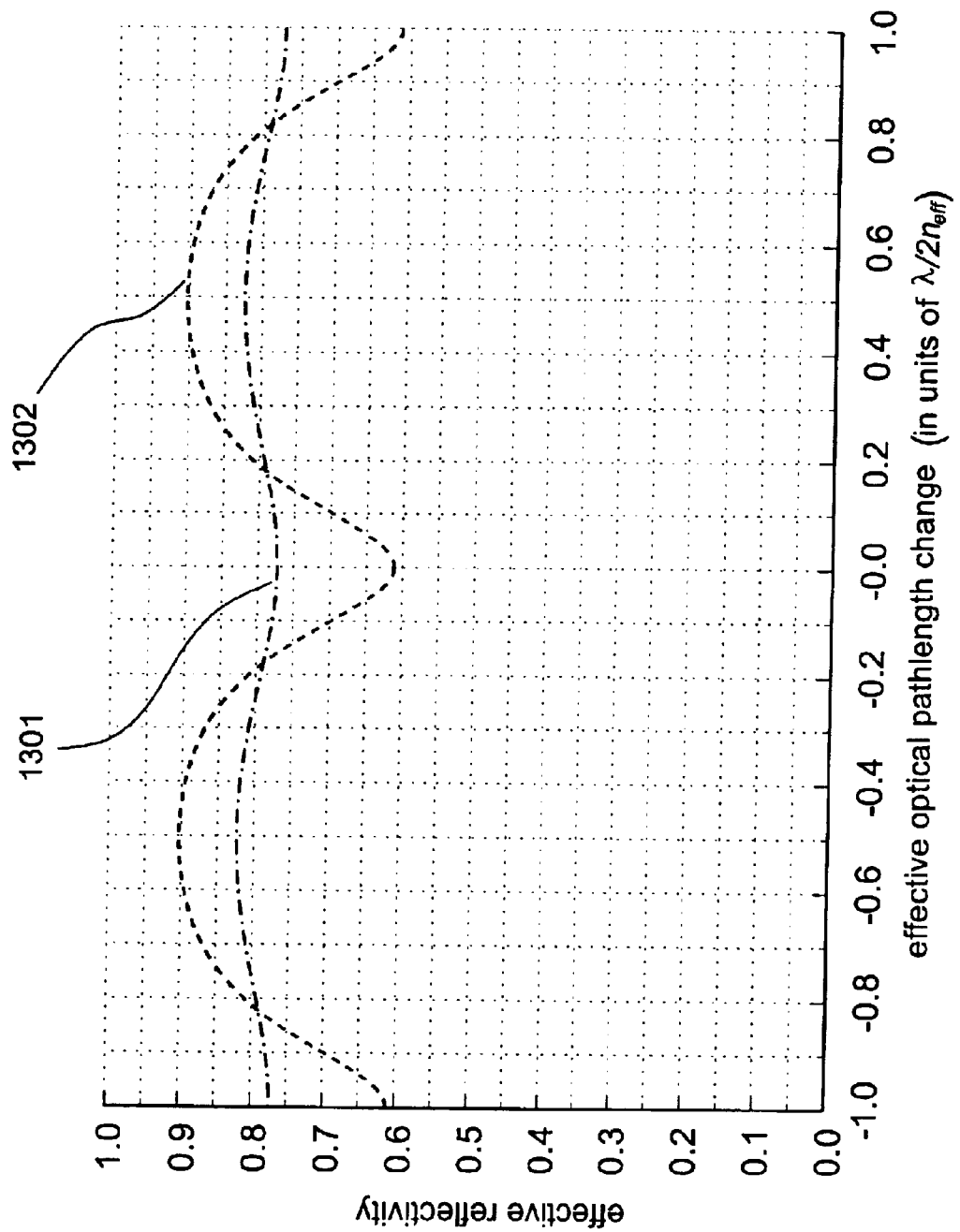
FIGS. 13A and 13B show effective grating reflectivity spectral profiles.

Fabrication of laser gain medium 110 and an integrated waveguide wherein the effective end face to grating distance is sufficiently accurately determined to mitigate the effects of end face reflectivity (i.e., to enable predictably and reproducibly hitting a particular point on a trace such as 1302 of FIG. 13A during design and fabrication of a waveguide grating) may be problematic, and certainly technically demanding and expensive. The traces span variation in the effective end face to grating distance of only $\lambda/n_{eff}$, so to obtain a desired effective reflectivity this distance must be accurately fabricated to better than 0.1 nm. Such accuracy is difficult to achieve in and of itself, and is further complicated by the observation that the effective "position" of the grating may vary widely with subtle (and not necessarily readily observable or measurable) variations in the fabrication of the grating. Such difficulties may be reduced and/or substantially avoided, and substantially accurate and reproducible waveguide grating effective reflectivity profiles may be produced, by minimizing reflectivity of the semiconductor end face (as in the example of trace 1301 of FIG. 13A).

Figure 13B:
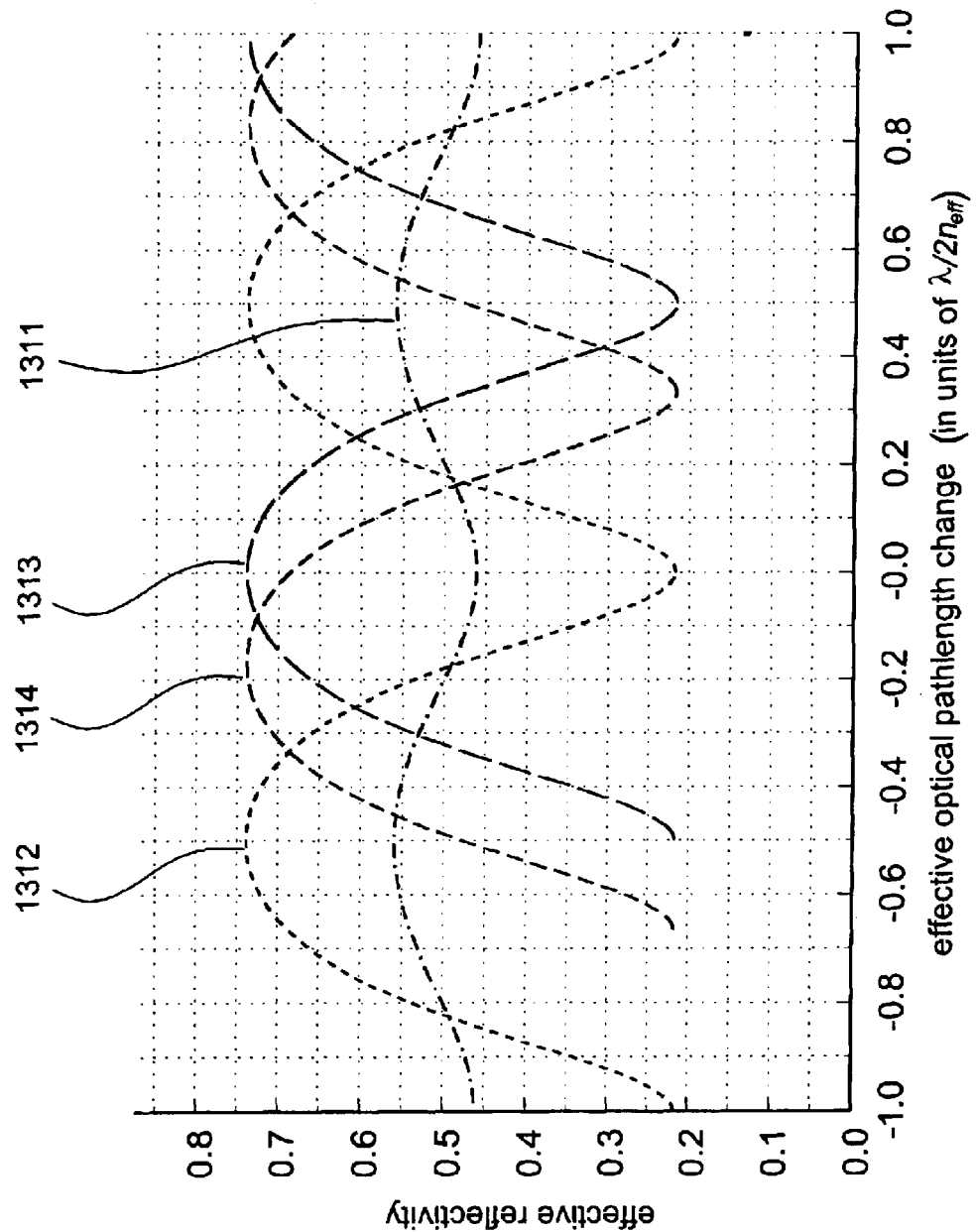

There are circumstances, however, wherein reflectivity at end face 110 may provide an operational advantage for producing grating-stabilized semiconductor lasers as disclosed herein. In particular, it is often the case that significant optical losses arise at the junction between the laser gain medium and an integrated end-coupled waveguide (at the gain medium end face). These losses may arise, for example, due to a proximal end of one or both of the semiconductor and grating waveguides lacking substantially complete optical confinement (due to the practicalities of fabrication of the end face and integrated waveguide), thereby giving rise to diffractive optical losses. The reasons for these diffractive losses, and various fabrication strategies for minimizing these diffractive losses, are described in detail in earlier-cited application Ser. Nos. 60/442,288 and 60/462,600. The presence of such junction losses may drastically reduce the effective reflectivity of the waveguide grating. Carrying the illustrative example from above still further, the effective grating reflectivity of an 80% reflective grating with an optical junction loss of 20% is only 51.2% (assuming no reflectivity at the end face). Such decreased reflectivity in turn may lead to low laser output power, high lasing threshold current, accelerated failure of laser devices due to higher required drive currents, increased sensitivity to optical feedback, mode hopping and/or frequency shifting, power fluctuations, and so on. Even a small residual reflectivity (0.5%) at the end face 120 results in noticeable dependence of the effective grating reflectivity on the effective end face to grating distance (for a given wavelength; trace 1311 of FIG. 13B; 80% grating reflectivity and 20% junction loss in this example).

If some degree of uncertainty as to the precise effective reflectivity level and spectral profile are operationally acceptable, however, providing some higher degree of reflectivity at the end face of the semiconductor laser gain medium (at the optical junction with the integrated waveguide) may provide higher effective grating reflectivity (at least at some wavelengths) and may therefore mitigate at least some of the problems arising from optical losses at the optical junction. Such reflectivity should still be sufficiently small so as to substantially avoid laser oscillation in unwanted longitudinal modes, and may about 5% or more, or may be about 10% or more. For example, if 14% reflectivity (i.e., no AR coating between a III–V semiconductor gain medium and a silica-based low-index integrated waveguide) is added at the semiconductor end face in the illustrative example (80% reflective grating and 20% junction loss), then the effective reflectivity trace 1312 of FIG. 13B results. The effective waveguide grating reflectivity varies substantially, from a minimum of about 22% to a maximum of about 74%. Determining ahead of time (during fabrication) where on this curve a particular laser/waveguide grating combination will lie is problematic (for the reasons given above). However, in this example a substantial fraction (about 70%) of a random population of devices will have an effective end face to grating distance resulting in an effective grating reflectivity at least as large as the effective reflectivity with low end face reflectivity, and a smaller but still significant fraction (nearly half of randomly distributed devices have effective reflectivity at or above 60%. Therefore, the effective reflectivity of the grating-stabilized semiconductor lasers thus produced is increased, thereby mitigating at least some of the problems enumerated above, at the expense of lack of precise foreknowledge as to the precise center wavelength, spectral profile, and reflectivity of the waveguide grating, as well as decreased device yield (low effective reflectivity devices might be discarded). Analogous behaviors are observed for other reflectivity levels for the end face and/or grating.

Figure 14A:
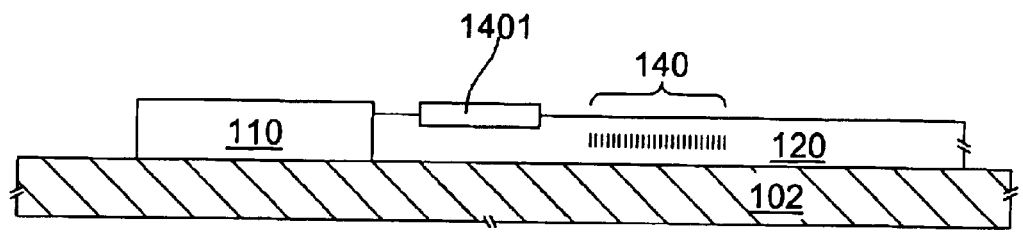
FIGS. 14A, 14B, and 14C are schematic side views of various exemplary grating-stabilized semiconductor lasers.

Device yield may be restored by the addition of additional design elements and fabrication/assembly steps. As shown in the schematic exemplary embodiments of FIGS. 14A/14B/14C, a portion of the grating waveguide between the semiconductor end face and the grating waveguide segment is adapted for enabling alteration of the modal index thereof. In the example of FIG. 14A, a portion of the upper cladding is thinned, and a set of two or more phase shifter inserts 1401 may be provided, each comprising a piece of optical material that may be placed on the thinned portion of the cladding and so alter the modal index along that portion of the waveguide. Two such pieces may be provided of differing indices, so that light propagating from the end face to the grating waveguide segment and back to the end face undergoes a relative phase shift of about $\pi$ depending on which of the two inserts 1401 is placed on the waveguide. Referring to the exemplary traces 1312 and 1313 of FIG. 13B (in which the effective end face to grating distances (more properly, optical path length) differ by an amount to yield the relative $\pi$ phase shift, it is seen that such a scheme ensures that all semiconductor/waveguide grating pairs in this exemplary case will exhibit an effective grating reflectivity of at least 60%, and about 90% exhibit effective grating reflectivity of at least 65%, using one of the two available inserts. If three inserts 1401 are employed (providing relative phase shifts of about 0 for trace 1312, about $2\pi/3$ for trace 1314, and about $4\pi/3$ [not shown]), then all semiconductor/waveguide grating pairs in this exemplary case exhibit effective reflectivity of at least 68% if the correct phase shifter is selected for each. Analogous behaviors are observed for other reflectivity levels for the end face and grating. Larger sets of different phase shifter inserts 1401, providing differing phase shifts over the range of 0 to $2\pi$, may be employed for progressively more accurately providing the proper phase shift for providing maximum effective reflectivity (for a given combination of grating reflectivity, end face reflectivity, and optical junction loss). In addition to improving device yields, the use of such incremental phase shifters also has the effect of improving the accuracy with which the design center wavelength, spectral profile, and reflectivity level may be targeted.

Figure 14B:
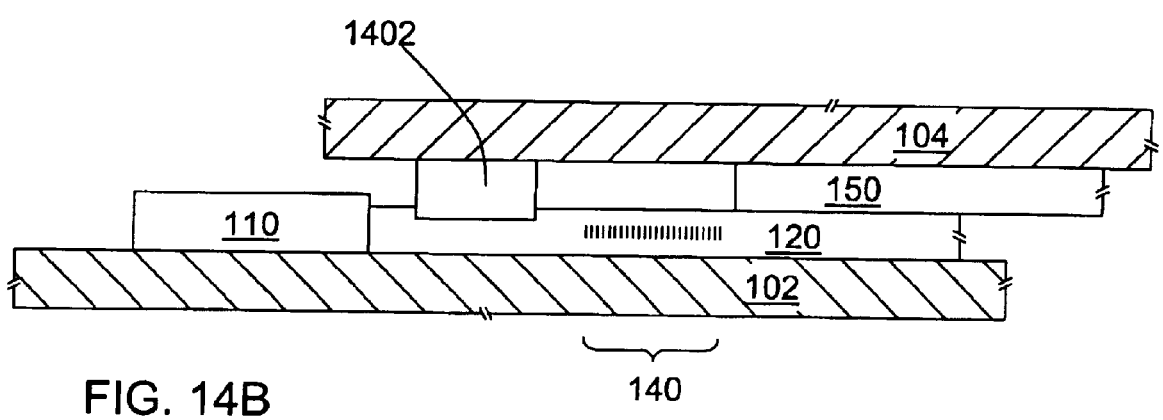
Figure 14C:
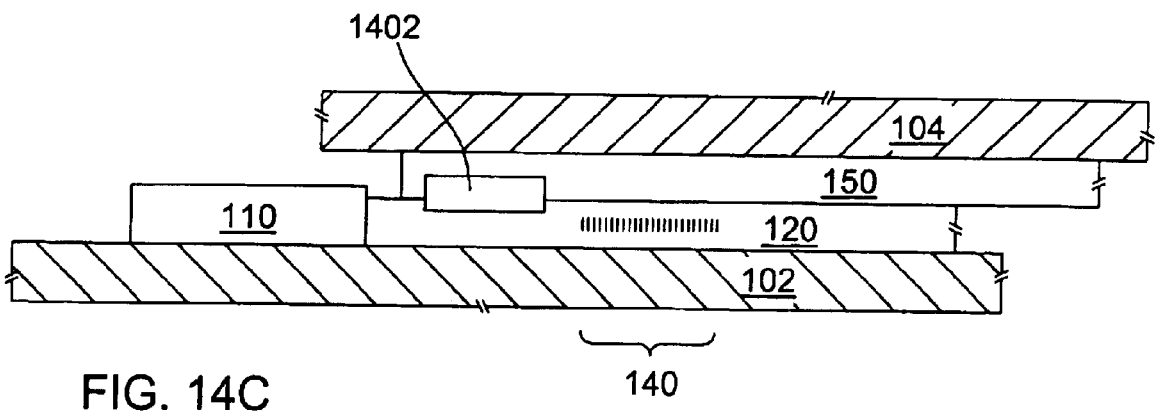

Instead of providing the incremental phase shifters described in the preceding paragraph as separate components, they may instead be incorporated into other components to be assembled with the semiconductor laser. For example, it may be the case that the semiconductor laser substrate (with gain medium 110 and integrated waveguide 120 and waveguide grating segment 140 thereon) is adapted for providing transverse transfer of the laser output to another similarly adapted waveguide 150 on another waveguide substrate 104, and the semiconductor substrate 102 is intended to be flip-chip mounted onto the waveguide substrate 104 (FIGS. 14B and 14C). Incremental phase shifters 1402 may be incorporated into waveguide substrate 104 (FIG. 14B) orwaveguide 150 (FIG. 14C) so that upon assembly, optical transverse-transfer is enabled between waveguides 120 and 150, and the phase shifter 1402 is suitably positioned relative to waveguide 120. Differing waveguide substrates 104, with differing incremental phase shifts built in, may be provided. The process of cycling through the various phase shifters and testing to find the most appropriate one may be readily automated, and may be incorporated into other automated assembly and/or testing procedures (whether the phase shifters are provided as separate components 1401 or components 1402 incorporated into other assembled components).

Instead of the discrete incremental phase shifters described hereinabove, an active compensator may be provided for waveguide 120 between grating waveguide segment 140 and reflective end face 111 of semiconductor gain medium 110. Such a phase shifting compensator may be similar in nature to compensators 250 described hereinabove, and may include thermo-optic, current-dependent, electro-optic, non-linear-optic, or other types of compensators, along with the corresponding control elements therefor. The control element for such a compensator may be adjusted to substantially achieve the correct phase shift (i.e., maximum effective reflectivity and laser output wavelength matched to the grating design wavelength), and then substantially fixed at this control signal level. Alternatively, an error signal may be generated and used to substantially maintain the correct phase shift through feedback control of the compensator through its control element. Such wavelength-locking feedback control may be provided by any suitable scheme, as discussed hereinabove.

Alternatively, a variable phase shift may be provided during the fabrication using a so-called "trimming" process. Material of a suitable refractive index may be gradually added to, or may be added to in a discrete amount and then gradually removed from, a segment of waveguide 120 between the laser gain medium and the waveguide grating. The added material, differing in refractive index from the waveguide cladding, alters the waveguide modal index and so alters the phase shift. The output power of the laser may be monitored for controlling the trimming processes, terminating the addition/removal of material when a targeted or optimum laser power level is reached, for example.

Control and feedback mechanisms discussed thus far have pertained primarily to ensuring stable operation of a grating-stabilized semiconductor laser within or at least near the wavelength defined by the grating reflectivity profile. Typically, the center wavelength, the spectral reflectivity profile, and the reflectivity level may be accurately designed and then accurately fabricated to the targeted design. These design characteristics may however vary with ambient conditions, particularly temperature, so that a suitable control and/or stabilization mechanism may be required if absolute wavelength accuracy is an issue. If absolute wavelength accuracy is not critical, feedback mechanisms for a single-longitudinal-mode laser may nevertheless be implemented to avoid unwanted mode-hops and/or power fluctuations. If absolute wavelength accuracy (within operationally acceptable tolerance limits) is a requirement, then the laser grating waveguide segment must be stabilized in some way.

In many cases it may be sufficient to simply control the temperature of the waveguide grating segment and/or the portion of substrate on which it rests, without active feedback dependent on an optically derived error signal. A temperature setting may be selected to provide the desired design wavelength. In other instances, active feedback control, for controlling the grating temperature based on an optically derived error signal, must be employed for locking the laser output wavelength to some wavelength reference standard. Any suitable wavelength reference, wavelength locking scheme, and/or error signal generation scheme may be employed, as described hereinabove. If active feedback control is used, other mechanisms may be employed for controlling the grating wavelength, either in addition to or instead of grating temperature control. Such mechanisms may include thermo-optics, current injection, electro-optics, non-linear-optics, or other suitable mechanisms. Whether the grating wavelength is actively or passively controlled, a second compensator of any suitable type may be employed and independently controlled for centering a resonator longitudinal mode relative to the grating spectral profile in a single-longitudinal-mode laser, as described extensively hereinabove. If the reference waveguide grating segments are used that are of a substantially similar type as the laser waveguide grating segment, they may be temperature-controlled along with the laser waveguide grating.

Instead of relying on the waveguide grating segment to fix the output wavelength of the semiconductor laser, the grating wavelength may be intentionally shifted in order to tune the laser output, typically over a limited range. In an exemplary embodiment, a thermo-optic, electro-optic, current-injection, non-linear-optic, or suitable element may be positioned on or near, or incorporated into, the waveguide grating segment, so that altering the refractive index of the element (using a suitable control element) results in a shift of the grating wavelength. The grating wavelength (and therefore the laser output wavelength) may therefore be tuned by suitable adjustment of the control element. Such control may be passive (i.e., a control signal level may be set but is not subject to feedback control), or active feedback control may be employed for slaving the laser tuning to some external reference, in any suitable manner using any suitable wavelength reference. If the laser is a single-longitudinal-mode laser, then an additional compensator and corresponding additional control mechanism therefor may be employed, as variously described hereinabove, for maintaining the single longitudinal mode centered with respect to the waveguide grating as it tunes. If reference waveguides are employed for such an control mechanism they may be tuned along with the laser waveguide grating segment for the control mechanism to function properly. One way to accomplish this if for the laser waveguide grating and the reference waveguide gratings to be substantially similar in materials and construction, to be located near each other on a common substrate, and to be subject to the same or similar control element and control signal for active feedback.

Figure 15A:
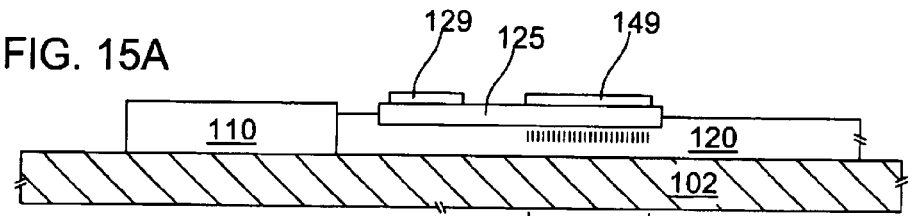
FIGS. 15A through 15E are schematic side views of various exemplary grating-stabilized semiconductor lasers.
Figure 15B:
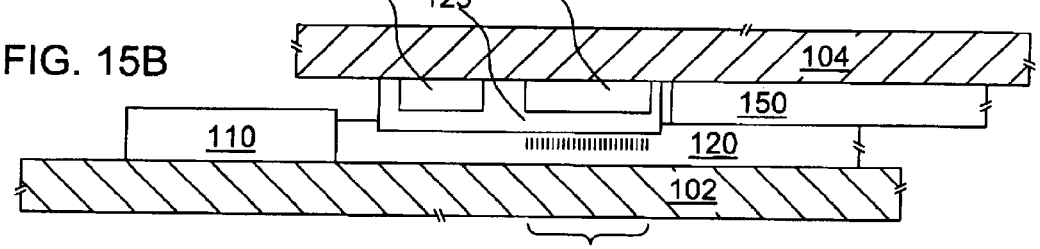
Figure 15C:
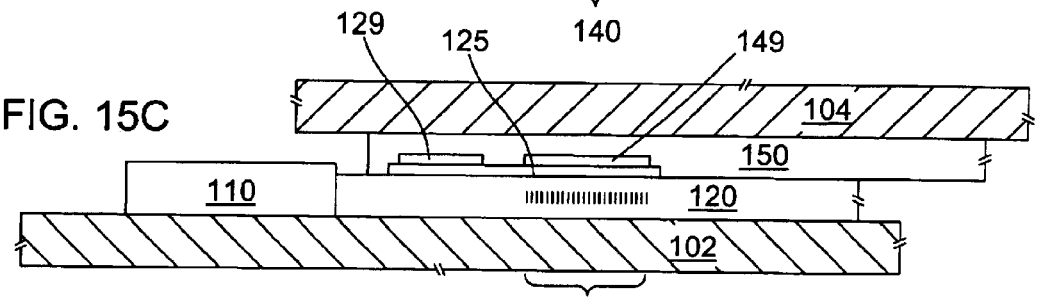
Figure 15D:
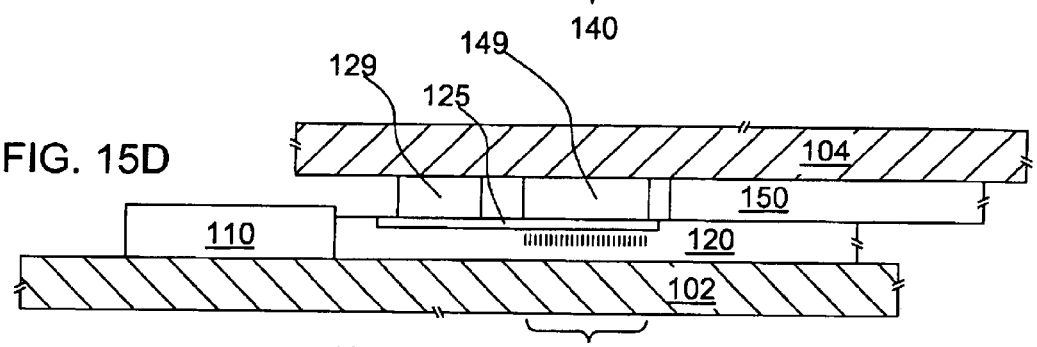
Figure 15E:
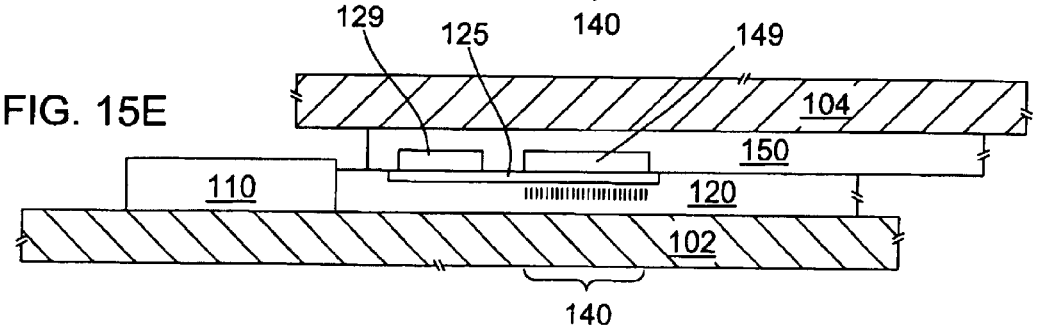

Exemplary embodiments of a tunable semiconductor laser are shown in FIGS. 15A–15E in which a thermo-optic material 125 is placed near the core of the grating waveguide segment 140 and near the core of a portion of waveguide 120 between the semiconductor end face 111 and the grating waveguide segment. Two spatially separate and separately controlled heating elements 129 and 149 are positioned on the thermo-optic material at waveguide 120 and waveguide grating segment 140, respectively. A wavelength tuning control signal may be applied to heating element 149 for tuning the laser output wavelength (and which may be passively or actively controlled, as appropriate). A separate feedback control signal may be applied to heating element 129 for locking the single-longitudinal-mode frequency to the grating wavelength as it is tuned. Other control mechanisms, as enumerated hereinabove, may be used in place of one or more of heating elements 126 and 149 and thermo-optic material 125. Separate thermo-optic elements may be provided, instead of a single thermo-optical element spanning both waveguide regions. The thermo-optic element(s) and heating elements may be incorporated onto waveguide 120 as shown in FIG. 15A or onto a separate waveguide 150 or its substrate 104 (FIGS. 15B and 15C). Embodiments may be constructed in which the thermo-optic element(s) is/are incorporated onto waveguide, while the heating elements are provided on a separate waveguide 150 or its substrate 104 (FIGS. 15D and 15E).

Figure 9B:
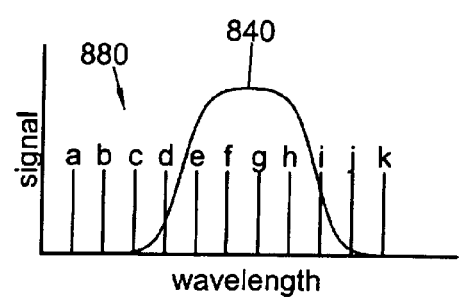

It should be noted that a second feedback/control mechanism is not typically required for tuning a multiple-longitudinal-mode semiconductor laser as described hereinabove. As the waveguide grating segment wavelength is tuned, it is substantially immaterial whether the resonator longitudinal modes track along with it or not. Longitudinal modes will move into and out of the grating reflectivity profile as it is tuned, without substantially effecting the laser output (FIGS. 9A and 9B).

Figure 16A:
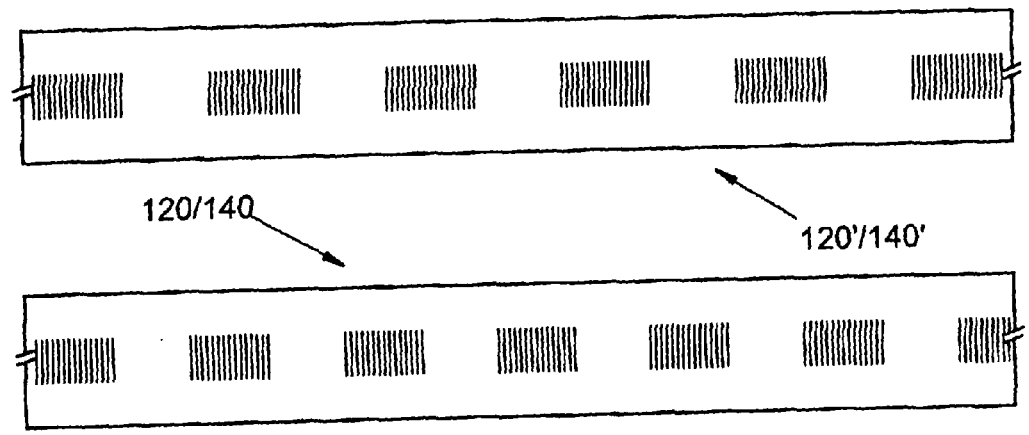
FIG. 16A is a schematic top view of exemplary waveguide gratings.
Figure 16B:
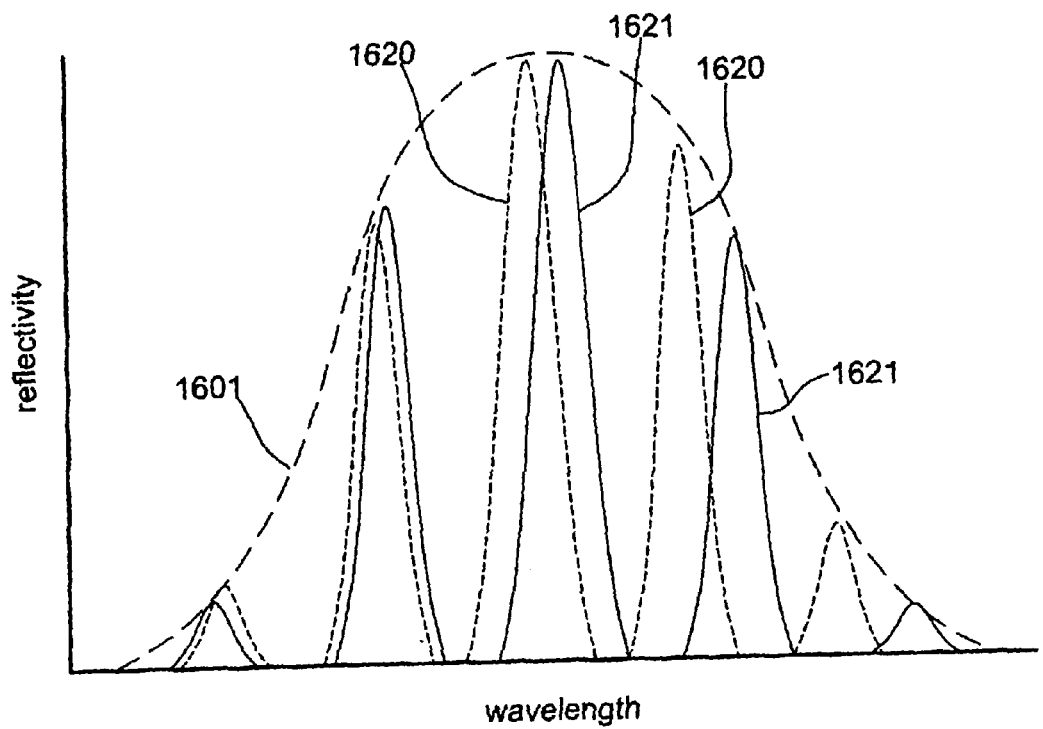
FIG. 16B shows corresponding grating reflectivity spectral profiles.

For further facilitating tuning of the grating-stabilized semiconductor over a larger range with a smaller control signal, a pair of so-called "sampled-gratings" may be employed for waveguide grating segments 140 and 140' (as in the embodiments of FIGS. 1C, 1E, 2C, and 2E). Each sampled grating has an underlying grating period, modulated by slightly offset sampling periods (FIG. 16A). Each sampled grating exhibits a modulated reflectivity profile including a series of substantially regularly spaced peaks 1620 and 1621 within an envelope 1601 (FIG. 16B). The envelope function 1601 may be determined by the underlying grating period, while the multi-peak traces 1620 and 1621 arise from the sampling periods. The two gratings may have substantially the same underlying grating period or slightly differing periods, and slightly offset sampling periods. The spacing of the spectral peaks therefore differs slightly between the two gratings, and the overall resonator will only support laser oscillation when peaks from each sampled grating overlap one another. Using thermal, thermo-optic, current-injection, electro-optic, non-linear-optic, or other mechanism to alter the index near one or both gratings, the spectral profiles may be made to sweep past one another, with differing peaks overlapping as this occurs. The slightly differing peak spacing behaves like a vernier scale, resulting in a substantially larger laser wavelength shift for a given control signal level than could be achieved by applying the control signal to a single non-sampled grating. Passive control or active feedback control may be employed for setting the laser wavelength, and additional feedback may be employed for enabling stable single-longitudinal-mode operation.

Laser gain medium 110 may comprise any suitable set of semiconductor layers deposited and/or grown on semiconductor substrate 102. These layers typically comprise a core and upper and lower cladding. The core may include one or more active layers in which the optical gain is generated by injection of current, and may further include one or more surrounding layers for confining carriers generated within the active layer(s). The upper and lower cladding each may include one or more layers for confining, from above and below, respectively, optical mode(s) of the semiconductor laser. Lateral confinement of laser resonator optical mode(s) may be accomplished in a variety of ways using spatially selective material processing of the semiconductor laser layers. All or part of one or more of the core and upper and lower cladding may be spatially selectively removed to form a ridge waveguide structure. In more complex waveguide structures, lower index material may be deposited on the sides of a ridge waveguide structure thus formed. Localization of current injected into the active layer(s), by suitable spatially selective formation of electrical contacts on the semiconductor gain medium and/or by suitable spatially selectively formation of lateral electrical insulators, may also serve to laterally confine optical mode(s) supported by the semiconductor laser resonator. Multiple semiconductor laser gain media may be concurrently fabricated on a common semiconductor wafer using wafer scale spatially selective material processing.

Materials differing from those used to form laser gain medium 110 may be used for forming at least one of integrated waveguide(s) 120/120'/130/130' on semiconductor substrate 102 (one or both of: waveguide 120 in FIG. 1A; waveguides 120/120' in FIGS. 1B/1C; waveguides 120/130' in FIGS. 1D/1E; waveguide 130 in FIG. 2A; waveguides 120'/130 in FIGS. 2B/2C; waveguides 130/130' in FIGS. 2D/2E). Low-index optical materials such as silica, silica-based materials (including doped silicas), other glasses, silicon nitride and oxynitrides, polymers, and so forth may be employed for forming integrated waveguide(s) 120/120'/130/130' on semiconductor substrate 102. Such integrated waveguide(s) may be positioned on substrate 102 relative to laser gain medium 110 for enabling transfer of optical power therebetween, typically by end-transfer (equivalently, end-coupling) of optical power through end face(s) 111 and/or 112. A wide array of structures and fabrication schemes therefor may be implemented, as well as various adaptations of end face(s) 111 and/or 112 and the proximal end(s) of waveguide(s) 120/120'/130/130', and these are disclosed in detail in earlier-cited application Ser. No. 60/442,288 and application Ser. No. 60/462,600.

One such adaptation of end face(s) 111 and/or 112 may include an anti-reflection coating or angled end face for suppressing unwanted laser oscillation (in which an end face functions as a resonator end mirror), since the differing materials of gain medium 110 and waveguide(s) 120/120'130/130' typically result in non-negligible reflectivity at the end face(s). For example, a $\lambda/4$ layer of silicon nitride between a III–V semiconductor laser gain medium and a silica-based waveguide reduces the reflectivity of the end face to about 1%. Alternatively (as described hereinabove), laser end face 111 may be adapted for providing some reflectivity (at least 5%, at least 10%, perhaps more) for enhancing the overall effective reflectivity of the waveguide grating segment 140, but still without supporting laser oscillation in unwanted modes. Similarly, reflectivity at end face 112 may enhance the overall reflectivity of waveguide grating segment 140', if present. As already described in various preceding paragraphs, low-index integrated waveguide(s) 120/120'/130/130', any end face(s) thereof, any waveguide grating segment(s) thereof, and/or other adaptations thereof, as well as any suitable adaptations of laser gain medium end faces 111 and/or 112, may be provided using spatially selective material processing on a wafer scale for many semiconductor lasers and corresponding waveguides concurrently on a common semiconductor substrate wafer. Since differing material are employed, fabrication of laser gain medium 110 and any low-index waveguide(s) integrated therewith is typically performed sequentially.

In exemplary embodiments of semiconductor lasers shown in FIG. 2A–2E, laser gain medium 110 is formed on a semiconductor substrate 102 as described hereinabove, while waveguide 120 and waveguide grating segment 140 are formed on a separate waveguide substrate 101 and assembled with laser gain medium 110. Waveguide 120 may typically comprise a PLC waveguide on a silicon substrate, the PLC waveguide typically including silica or silica-based cladding surrounding silica-based, silicon nitride, and/or silicon oxynitride core(s). Other materials may be equivalently employed. Substrates 101 and 102 are assembled together so as to enable optical power transfer between laser gain medium 110 and waveguide 120, thereby forming a semiconductor laser resonator that includes both laser gain medium 110 on substrate 102 and at least a portion of waveguide 120 on substrate 101.

For the exemplary embodiments of FIGS. 2A–2E, multiple laser gain media 110 and corresponding end faces 111 thereof (including any required/desired coating) may be fabricated concurrently on a wafer scale using spatially selective material processing. Multiple corresponding external transfer waveguides 130 and any required/desired adaptations thereof may be similarly implemented on a wafer scale using spatially selective material processing. The semiconductor substrate wafer may then be divided into individual laser substrates 102, each with a laser gain medium 110 and corresponding integrated external transfer waveguide 130. Similarly, multiple waveguides 120, each including a grating waveguide segment 140, may be fabricated concurrently on a wafer scale (on a waveguide substrate wafer) using spatially selective material processing, along with other associated waveguides and/or optical structures of an optical system or subsystem (if any). The waveguide substrate wafer may be divided into individual waveguide substrate 101, each with a waveguide 120, grating waveguide segment 140 thereof, and any other optical waveguides and/or other optical structures comprising an optical system or subsystem (if any). Whether fabricated on a wafer scale among multiple components, or fabricated individually, assembly of a substrate 102 (with a laser gain medium 110 and external transfer waveguide 130 thereon) with a substrate 101 (with a waveguide 120 and waveguide grating segment 140 thereon), so as to establish sufficient transverse-transfer of optical power between waveguides 120 and 130, forms at least a portion of a semiconductor laser resonator, with waveguide grating segment 140 serving as one of the resonator end mirrors.

For the exemplary embodiments of FIGS. 2D and 2E, multiple sets of corresponding waveguides 120 (each including waveguide grating segment 140) and waveguides 120' (each including one or both of a waveguide grating segment 140' and an end face 121'), may be fabricated concurrently on a wafer scale (on a waveguide substrate wafer) using spatially selective material processing, along with other associated waveguides and/or optical structures of an optical system or subsystem (if any). The waveguide substrate wafer may be divided into individual waveguide substrate 101, each with a waveguide 120, grating waveguide segment 140 thereof, a waveguide 120', one or both of waveguide grating segment 140' and end face 121' thereof, and any other optical waveguides and/or other optical structures comprising an optical system or subsystem (if any). Whether fabricated on a wafer scale among multiple components, or fabricated individually, assembly of a semiconductor substrate 102 (with a laser gain medium 110 and external transfer waveguides 130/130' thereon) with a substrate 101 (with a waveguides 120/120' thereon), so as to establish sufficient transverse-transfer of optical power between waveguides 120 and 130 and between 120' and 130', forms a semiconductor laser resonator, with waveguide grating segment 140 serving as one of the resonator end mirrors, and waveguide grating segment 140' or end face 121' forming the other laser resonator end mirror. Waveguides 120 and 120', each assembled with laser gain medium 110, may be each be formed on a separate substrate (not shown) and individually assembled with laser gain medium 110, rather than being formed on a common substrate for simultaneous assembly.

In embodiments of a semiconductor laser that include a free reflective end face (i.e., an end face with no additional end-coupled waveguide integrated therewith) of either the laser gain medium 110 or an integrated waveguide 120' as one end mirror of the composite laser resonator (end face 112 in FIGS. 1A and 2A; end face 121' in FIGS. 1B and 2B), the reflective end face may be formed by cleaving the semiconductor wafer to form the end face. Index contrast between the semiconductor material(s) and its surroundings may provide sufficient reflectivity from the cleaved end face for enabling laser oscillation, or the cleaved end face may be provided with a suitable reflective coating for enabling laser oscillation at the reflective wavelength of the waveguide grating segment 140. Such a coating may be applied to multiple end faces of a single row of substrates 102 divided from the wafer (i.e., at the bar level), or may be applied to an end face on an individual substrate 102 after complete separation thereof from neighboring substrates. A reflective end face 112 or 121' may instead be formed and/or coated by wafer-scale material processing (as disclosed in earlier-cited application Ser. No. 60/442,288 and application Ser. No. 60/462,600).

Instead of employing differing materials, in various of the exemplary embodiments of FIGS. 1A–1F and 2A–2E, one or both of the waveguides on semiconductor substrate 102 may be integrally formed with laser gain medium 110 using the same or similar semiconductor materials as those used to form laser gain medium 110 (one or both of: waveguide 120 in FIG. 1A; waveguides 120/120' in FIGS. 1B/1C; waveguides 120/130' in FIGS. 1D/1E; waveguide 130 in FIG. 2A; waveguides 120'/130 in FIGS. 2B/2C; waveguides 130/130' in FIGS. 2D/2E). In some such alternative embodiments, it may be the case that laser gain medium 110 and an integrated semiconductor grating waveguide segment coexist along a single semiconductor waveguide, as in DFB semiconductor lasers. In other such embodiments (DBR semiconductor lasers, for example), laser gain medium 110 and an integrated semiconductor waveguide (perhaps including a waveguide grating segment thereof) may comprise separate portions of a single semiconductor waveguide. These separate waveguide portions may differ in structure and/or optical properties, including but not limited to: presence vs. absence of grating features, differing layer sequences and/or thicknesses, differing degrees of quantum well inter-mixing, differing optical confinement features (lateral and/or vertical), differing bandgaps, differing layer compositions/doping, and so forth. Depending on the particular embodiment (FIGS. 1A–1F and 2A–2E), one or two integrated semiconductor waveguide(s) (120/120'/130/130') may be provided concurrently for each of multiple laser gain media 110 on a common semiconductor substrate using wafer scale spatially selective material processing. Such wafer-scale fabrication of integrated semiconductor waveguide(s) may be performed concurrently with fabrication of laser gain medium 110, or fabrication of laser gain medium 110 and any semiconductor waveguide(s) integrated therewith may be performed sequentially. Similarly, spatially selective material processing may be employed on a wafer scale for forming a waveguide grating segment 140 in an integrated semiconductor waveguide 120 and/or a waveguide grating segment 140' in an integrated semiconductor waveguide 120'.

Additional adaptations, for suppressing unwanted laser oscillation in optical modes supported by less than the entire composite laser resonator, may not be required at the juncture of laser gain medium 110 and an integrated semiconductor waveguide, since end face(s) 111 and/or 112 may provide little or no reflectivity. This lack of reflectivity may be due to the similarity of material(s) for semiconductor gain medium 110 and integrated semiconductor waveguide(s), and/or due to the lack of a well-defined structural boundary between them. If such additional adaptations are required, end face(s) 111 and/or 112 may be anti-reflection coated in any suitable manner, and/or angled away from normal, so as to reduce reflective feedback therefrom into gain medium 110.

For purposes of the foregoing written description and/or the appended claims, "index" may denote the bulk refractive index of a particular material (also referred to herein as a "material index") or may denote an "effective index" $n_{eff}$, related to the propagation constant $\beta$ of a particular optical mode in a particular optical element by $\beta=2\pi n_{eff}/\lambda$. The effective index may also be referred to herein as a "modal index". As referred to herein, the term "low-index" shall denote any materials and/or optical structures having an index less than about 2.5, while "high-index" shall denote any materials and/or structures having an index greater than about 2.5. Within these bounds, "low-index" may refer to: silica ($SiO_x$), germano-silicate, boro-silicate, other doped silicas, and/or other silica-based materials; silicon nitride ($Si_xN_y$) and/or silicon oxynitrides ($SiO_xN_y$); other glasses; other oxides; various polymers; and/or any other suitable optical materials having indices below about 2.5. "Low-index" may also include optical fiber, optical waveguides, planar optical waveguides, and/or any other optical components incorporating such materials and/or exhibiting a modal index below about 2.5. Similarly, "high-index" may refer to materials such as semiconductors, IR materials, and/or any other suitable optical materials having indices greater than about 2.5, and/or optical waveguides of any suitable type incorporating such material and/or exhibiting a modal index greater than about 2.5. The terms "low-index" and "high-index" are to be distinguished from the terms "lower-index" and "higher-index", also employed herein. "Low-index" and "high-index" refer to an absolute numerical value of the index (greater than or less than about 2.5), while "lower-index" and "higher-index" are relative terms indicating which of two particular materials has the larger index, regardless of the absolute numerical values of the indices.

For purposes of the foregoing written description and/or the appended claims, the term "optical waveguide" (or equivalently, "waveguide") as employed herein shall denote a structure adapted for supporting one or more optical modes. Such waveguides shall typically provide confinement of a supported optical mode in two transverse dimensions while allowing propagation along a longitudinal dimension. The transverse and longitudinal dimensions/directions shall be defined locally for a curved waveguide; the absolute orientations of the transverse and longitudinal dimensions may therefore vary along the length of a curvilinear waveguide, for example. Examples of optical waveguides may include, without being limited to, various types of optical fiber and various types of planar waveguides. The term "planar optical waveguide" (or equivalently, "planar waveguide") as employed herein shall denote any optical waveguide that is provided on a substantially planar substrate. The longitudinal dimension (i.e., the propagation dimension) shall be considered substantially parallel to the substrate. A transverse dimension substantially parallel to the substrate may be referred to as a lateral or horizontal dimension, while a transverse dimension substantially perpendicular to the substrate may be referred to as a vertical dimension. Examples of such waveguides include ridge waveguides, buried waveguides, semiconductor waveguides, other high-index waveguides ("high-index" being above about 2.5), silica-based waveguides, polymer waveguides, other low-index waveguides ("low-index" being below about 2.5), core/clad type waveguides, multi-layer reflector (MLR) waveguides, metal-clad waveguides, air-guided waveguides, vacuum-guided waveguides, photonic crystal-based or photonic bandgap-based waveguides, waveguides incorporating electro-optic (EO) and/or electro-absorptive (EA) materials, waveguides incorporating non-linear-optical (NLO) materials, and myriad other examples not explicitly set forth herein which may nevertheless fall within the scope of the present disclosure and/or appended claims. Many suitable substrate materials may be employed, including semiconductor, crystalline, silica or silica-based, other glasses, ceramic, metal, and myriad other examples not explicitly set forth herein which may nevertheless fall within the scope of the present disclosure and/or appended claims.

One exemplary type of planar optical waveguide that may be suitable for use with optical components disclosed herein is a so-called PLC waveguide (Planar Lightwave Circuit). Such waveguides typically comprise silica or silica-based waveguides (often ridge or buried waveguides; other waveguide configuration may also be employed) supported on a substantially planar silicon substrate (typically with an interposed silica or silica-based optical buffer layer). Sets of one or more such waveguides may be referred to as planar waveguide circuits, optical integrated circuits, or opto-electronic integrated circuits. A PLC substrate with one or more PLC waveguides may be readily adapted for mounting one or more optical sources, lasers, modulators, and/or other optical devices adapted for end-transfer of optical power with a suitably adapted PLC waveguide. A PLC substrate with one or more PLC waveguides may be readily adapted (according to the teachings of prior-filed U.S. application Ser. No. 60/334,705, U.S. application Ser. No. 60/360,261, U.S. application Ser. No. 10/187,030, and/or U.S. application Ser. No. 60/466,799) for mounting one or more optical sources, lasers, modulators, and/or other optical devices adapted for transverse-transfer of optical power with a suitably adapted PLC waveguide (mode-interference-coupled, or substantially adiabatic, transverse-transfer; also referred to as transverse-coupling).

For purposes of the foregoing written description and/or appended claims, "spatially-selective material processing techniques" shall encompass epitaxy, layer growth, lithography, photolithography, evaporative deposition, sputtering, vapor deposition, chemical vapor deposition, beam deposition, beam-assisted deposition, ion beam deposition, ion-beam-assisted deposition, plasma-assisted deposition, wet etching, dry etching, ion etching (including reactive ion etching), ion milling, laser machining, spin deposition, spray-on deposition, electrochemical plating or deposition, electroless plating, photo-resists, UV curing and/or densification, micro-machining using precision saws and/or other mechanical cutting/shaping tools, selective metallization and/or solder deposition, chemical-mechanical polishing for planarizing, any other suitable spatially-selective material processing techniques, combinations thereof, and/or functional equivalents thereof. In particular, it should be noted that any step involving "spatially-selectively providing" a layer or structure may involve either or both of: spatially-selective deposition and/or growth, or substantially uniform deposition and/or growth (over a given area) followed by spatially-selective removal. Any spatially-selective deposition, removal, or other process may be a so-called direct-write process, or may be a masked process. It should be noted that any "layer" referred to herein may comprise a substantially homogeneous material layer, or may comprise an inhomogeneous set of one or more material sub-layers. Spatially-selective material processing techniques may be implemented on a wafer scale for simultaneous fabrication/processing of multiple structures on a common substrate wafer.

It should be noted that various components, elements, structures, and/or layers described herein as "secured to", "connected to", "deposited on", "formed on", or "positioned on" a substrate may make direct contact with the substrate material, or may make contact with one or more layer(s) and/or other intermediate structure(s) already present on the substrate, and may therefore be indirectly "secured to", etc, the substrate.

The terms "wavelength locking", "wavelength feedback control", and so forth as used herein shall denote generically any scheme in which the output wavelength is locked to some external wavelength reference. This may typically be accomplished by generating a suitable error signal from the laser output and the wavelength reference, and using the error signal thus generated to control some operational parameter of the laser through a suitable control element. "Locking" does not necessarily imply that the laser wavelength and the reference wavelength are the same; they may be offset from one another in some known fashion. A wide variety of wavelength references might be employed, some examples of which include, but are not limited to one or more: reference gratings, reference optical cavities, Fabry-Perot interferometers, other interferometers, etalons, atomic or molecular resonances, wavelength meters, spectrometers, combinations thereof, functional equivalents thereof, and so on. Error signals may be generated directly, or may be generated by small amplitude dithering of a wavelength control element. A wide variety of control elements may be employed for controlling the laser output wavelength, by controlling resonator longitudinal mode frequencies and/or controlling the waveguide grating reflectivity spectral profile. This may be accomplished in any suitable manner, including as examples but not limited to: thermo-optic elements and heating/cooling control sources, current injection elements and current control sources, electro-optic elements and voltage control sources, non-linear optical elements and optical control sources, and so on.

The phrase "operationally acceptable" appears herein describing levels of various performance parameters of optical components and/or optical devices, such as optical power transfer efficiency (equivalently, optical coupling efficiency), optical loss, optical gain, lasing threshold, undesirable optical mode coupling, and so on. An operationally acceptable level may be determined by any relevant set or subset of applicable constraints and/or requirements arising from the performance, fabrication, device yield, assembly, testing, availability, cost, supply, demand, and/or other factors surrounding the manufacture, deployment, and/or use of a particular optical device. Such "operationally acceptable" levels of such parameters may therefor vary within a given class of devices depending on such constraints and/or requirements. For example, a lower optical coupling efficiency may be an acceptable trade-off for achieving lower device fabrication costs in some instances, while higher optical coupling may be required in other instances in spite of higher fabrication costs. The "operationally acceptable" coupling efficiency therefore varies between the instances. In another example, higher lasing threshold arising from optical loss (due to scattering, absorption, undesirable optical coupling, and so on) may be an acceptable trade-off for achieving lower device fabrication cost or smaller device size in some instances, while a lower lasing threshold may be required in other instances in spite of higher fabrication costs and/or larger device size. The "operationally acceptable" lasing threshold therefore varies between the instances. Many other examples of such trade-offs may be imagined. Grating-stabilized semiconductor lasers and fabrication methods therefor as disclosed herein, and equivalents thereof, may therefore be implemented within tolerances of varying precision depending on such "operationally acceptable" constraints and/or requirements. Phrases such as "substantially adiabatic", "substantially spatial-mode-matched", "substantially modal-index-matched", "so as to substantially avoid undesirable optical coupling", and so on as used herein shall be construed in light of this notion of "operationally acceptable" performance.

While particular examples have been disclosed herein employing specific materials and/or material combinations and having particular dimensions and configurations, it should be understood that many materials and/or material combinations may be employed in any of a variety of dimensions and/or configurations while remaining within the scope of inventive concepts disclosed and/or claimed herein.

It is intended that equivalents of the disclosed exemplary embodiments and methods shall fall within the scope of the present disclosure and/or appended claims. It is intended that the disclosed exemplary embodiments and methods, and equivalents thereof, may be modified while remaining within the scope of the present disclosure and/or appended claims.

What is claimed is:

1. A laser, comprising:
   a laser gain medium having a first end face and a second end face;
   a low-index optical waveguide integrated with the laser gain medium on a laser substrate and optically end-coupled at its proximal end with the laser gain medium at the first end face;
   a waveguide grating segment optically coupled to the laser gain medium through the integrated waveguide, the waveguide grating segment providing optical feedback into the laser gain medium to support laser oscillation substantially restricted to a single longitudinal mode;
   a compensator for controlling a longitudinal mode wavelength;
   at least one wavelength reference and at least one detector for generating a laser-output-wavelength-dependent error signal; and
   a feedback mechanism for controlling the compensator in response to the error signal, thereby maintaining the longitudinal mode wavelength substantially locked with respect to the wavelength reference.

2. The laser of claim 1, wherein:
   the wavelength reference comprises a pair of reference waveguide grating segments having respective center wavelengths bracketing a center wavelength of the waveguide grating segment, each waveguide grating segment receiving at an input end thereof a portion of laser output and transmitting a fraction of the received portion of the laser output to an output end,
   the detector comprises a pair of photodetectors, each photodetector receiving the transmitted fraction of the laser output from the output end of a corresponding one of the reference waveguide grating segments,
   the error signal is derived from the pair of photodetectors, and
   the feedback mechanism controls the compensator in response to the error signal so as to maintain the longitudinal mode wavelength substantially locked with respect to the center wavelength of the waveguide grating segment.

3. The laser of claim 2, wherein the waveguide grating segment and the pair of reference waveguide grating segments are formed on a common substrate.

4. The laser of claim 2, wherein the waveguide grating segment is formed on a first substrate and the pair of reference waveguide grating segments are formed on a second substrate separate from the first substrate.

5. The laser of claim 1, wherein the compensator comprises a thermo-optic element and a heating element, heating of the thermo-optic element by the heating element shifting a longitudinal mode wavelength of the composite laser resonator.

6. The laser of claim 1, further comprising a second compensator for controlling a waveguide grating segment center wavelength.

7. The laser of claim 6, further comprising:
   at least one external wavelength reference and at least one secondary detector for generating an secondary laser-output-wavelength-dependent error signal; and
   a secondary feedback mechanism for controlling the second compensator in response to the secondary error signal, thereby maintaining the waveguide grating segment center wavelength substantially locked with respect to the external wavelength reference.

8. A laser, comprising:
   a laser gain medium having a first end face and a second end face;
   a waveguide grating segment optically coupled to the laser gain medium through the first end face, the waveguide grating segment providing optical feedback into the laser gain medium to support laser oscillation substantially restricted to a single longitudinal mode;
   a compensator for controlling a longitudinal mode wavelength;
   a pair of reference waveguide grating segments having respective center wavelengths bracketing a center wavelength of the waveguide grating segment, each waveguide grating segment receiving at an input end thereof a portion of laser output and transmitting a fraction of the received portion of the laser output to an output end;
   a pair of photodetectors, each photodetector receiving the transmitted fraction of the laser output from the output end of a corresponding one of the reference waveguide grating segments; and
   a feedback mechanism for controlling the compensator in response to an error signal,
   wherein
   the error signal is derived from the pair of photodetectors, and
   the feedback mechanism controls the compensator in response to the error signal so as to maintain the longitudinal mode wavelength substantially locked with respect to the center wavelength of the waveguide grating segment.

9. The laser of claim 8, wherein the waveguide grating segment and the pair of reference waveguide grating segments are formed on a common substrate.

10. The laser of claim 8, wherein the compensator comprises a thermo-optic element and a heating element, heating of the thermo-optic element by the heating element shifting a longitudinal mode wavelength of the composite laser resonator.

11. The laser of claim 8, further comprising a second compensator for controlling a waveguide grating segment center wavelength.

12. The laser of claim 11, further comprising:
   at least one external wavelength reference and at least one secondary detector for generating an secondary laser-output-wavelength-dependent error signal; and
   a secondary feedback mechanism for controlling the second compensator in response to the secondary error signal, thereby maintaining the waveguide grating segment center wavelength substantially locked with respect to the external wavelength reference.

* * * * *